US012586495B2

(12) United States Patent
An et al.

(10) Patent No.: US 12,586,495 B2
(45) Date of Patent: Mar. 24, 2026

(54) DISPLAY DEVICE INCLUDING CURRENT DETECTION DEVICE

(71) Applicant: Samsung Display Co., LTD., Yongin-si (KR)

(72) Inventors: Jin Sung An, Yongin-si (KR); Sung Ho Kim, Yongin-si (KR); Se Wan Son, Yongin-si (KR); Min Woo Woo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/801,123

(22) Filed: Aug. 12, 2024

(65) Prior Publication Data

US 2025/0259576 A1      Aug. 14, 2025

(30) Foreign Application Priority Data

Feb. 8, 2024      (KR) ........................ 10-2024-0019575

(51) Int. Cl.
| | |
|---|---|
| *G09G 3/32* | (2016.01) |
| *G09G 3/00* | (2006.01) |
| *G09G 3/3233* | (2016.01) |
| *H10K 59/126* | (2023.01) |

(Continued)

(52) U.S. Cl.
CPC ........... *G09G 3/006* (2013.01); *G09G 3/3233* (2013.01); *H10K 59/126* (2023.02); *G09G 2300/0413* (2013.01); *G09G 2300/0426* (2013.01); *G09G 2320/0214* (2013.01); *G09G 2330/12* (2013.01); *H10K 59/1213* (2023.02); *H10K 59/123* (2023.02)

(58) Field of Classification Search
CPC ................ G09G 3/006; G09G 3/3233; G09G 2300/0413; G09G 2300/0426; G09G 2320/0214; G09G 2330/12; H10K 59/126; H10K 59/1213; H10K 59/123
See application file for complete search history.

(56) References Cited

U.S. PATENT DOCUMENTS

| | | | |
|---|---|---|---|
| 8,711,138 B2 | 4/2014 | Kawabe | |
| 2015/0102302 A1* | 4/2015 | Kim ..................... | G09G 3/2003 |
| | | | 438/4 |

(Continued)

FOREIGN PATENT DOCUMENTS

| | | |
|---|---|---|
| CN | 110867151 A | 7/2022 |
| CN | 115798366 A | 3/2023 |

*Primary Examiner* — Pegeman Karimi
(74) *Attorney, Agent, or Firm* — Womble Bond Dickinson (US) LLP

(57) ABSTRACT

A display device includes: a display panel including a display area and a non-display area; a plurality of light emitting elements in the display area; and a current detection device in the non-display area. The current detection device includes a controller, and a current detection circuit to be controlled by the controller. The current detection circuit includes a first driver and a second driver; the first driver includes a first dummy light emitting element corresponding to a first light emitting element to provide light of a first color among the plurality of light emitting elements; and the second driver includes a second dummy light emitting element corresponding to a second light emitting element to provide light of a second color among the plurality of light emitting elements.

20 Claims, 18 Drawing Sheets

(51) Int. Cl.
    *H10K 59/121*      (2023.01)
    *H10K 59/123*      (2023.01)

(56)              References Cited

U.S. PATENT DOCUMENTS

2015/0108437 A1 *  4/2015  Cho ..................... G09G 3/3233
                                        257/40
2015/0248861 A1 *  9/2015  Kong ..................... G09G 3/006
                                     345/212
2020/0166797 A1 *  5/2020  Shih ................... G02F 1/13454

* cited by examiner

CFL:CF1,CF2,CF3
TFEL:TFE1,TFE2,TFE3
TFE1:TL1,TL2,TL3
ED:ED1,ED2,ED3

CT3
CNE1
CT6
CNE2

DR2
DR1
DR3

A

AE1

CT3

CNE1

CT6

CNE2

AE2

DR2

DR1

DR3

A

AE1'

CT3

CT6

AE2'

BNS'

BNS'

BNS'

DR2

DR1

DR3

DISPLAY DEVICE INCLUDING CURRENT DETECTION DEVICE

CROSS-REFERENCE TO RELATED APPLICATION

The present application claims priority to and the benefit of Korean Patent Application No. 10-2024-0019575, filed on Feb. 8, 2024, in the Korean Intellectual Property Office, the entire disclosure of which is incorporated by reference herein.

BACKGROUND

1. Field

Aspects of embodiments of the present disclosure relate to a display device, and more particularly, to a display device capable of quantitatively measuring a value of a lateral leakage current between pixels.

2. Description of the Related Art

An organic light emitting display device includes a display element of which a luminance is changed by a current, for example, such as an organic light emitting diode.

SUMMARY

One or more embodiments of the present disclosure may be directed to a display device capable of quantitatively measuring a value of a lateral leakage current between pixels.

According to one or more embodiments of the present disclosure, a display device includes: a display panel including a display area and a non-display area; a plurality of light emitting elements in the display area; and a current detection device in the non-display area. The current detection device includes a controller, and a current detection circuit configured to be controlled by the controller. The current detection circuit includes a first driver and a second driver; the first driver includes a first dummy light emitting element corresponding to a first light emitting element configured to provide light of a first color among the plurality of light emitting elements; and the second driver includes a second dummy light emitting element corresponding to a second light emitting element configured to provide light of a second color among the plurality of light emitting elements.

In an embodiment, the first driver may further include a first dummy transistor connected between a first terminal and the first dummy light emitting element.

In an embodiment, the current detection device may further include a second terminal connected to a first gate electrode of the first dummy transistor.

In an embodiment, the current detection device may further include a third terminal connected to a first anode electrode of the first dummy light emitting element.

In an embodiment, the current detection device may further include a fourth terminal connected to a first cathode electrode of the first dummy light emitting element.

In an embodiment, the second driver may further include a second dummy transistor connected between a fifth terminal and the second dummy light emitting element.

In an embodiment, the current detection device may further include a sixth terminal connected to a second gate electrode of the second dummy transistor.

In an embodiment, the current detection device may further include a seventh terminal connected to a second anode electrode of the second dummy light emitting element.

In an embodiment, a second cathode electrode of the second dummy light emitting element may be connected to the fourth terminal.

In an embodiment, the display device may further include a resistor connected between the first anode electrode of the first dummy light emitting element and the second anode electrode of the second dummy light emitting element.

In an embodiment, the light of the first color may be red light, and the light of the second color may be green light.

In an embodiment, the first driver and the second driver may be connected in parallel with each other.

In an embodiment, the first driver of the current detection circuit may include a plurality of first drivers; and the second driver of the current detection circuit may include a plurality of second drivers.

In an embodiment, a first anode electrode of the first dummy light emitting element of each of the plurality of first drivers may be connected to each other, and a first cathode electrode of the first dummy light emitting element of each of the plurality of first drivers may be connected to each other.

In an embodiment, each of the plurality of first drivers may further include a first dummy transistor. A first gate electrode of the first dummy transistor of each of the plurality of first drivers may be connected to each other, a first drain electrode of the first dummy transistor of each of the plurality of first drivers may be connected to each other, and a first source electrode of the first dummy transistor of each of the plurality of first drivers may be connected to each other.

In an embodiment, a second anode electrode of the second dummy light emitting element of each of the plurality of second drivers may be connected to each other, and a second cathode electrode of the second dummy light emitting element of each of the plurality of second drivers may be connected to each other.

In an embodiment, each of the plurality of second drivers may further include a second dummy transistor. A second gate electrode of the second dummy transistor of each of the plurality of second drivers may be connected to each other, a second drain electrode of the second dummy transistor of each of the plurality of second drivers may be connected to each other, and a second source electrode of the second dummy transistor of each of the plurality of second drivers may be connected to each other.

In an embodiment, the first dummy light emitting element of each of the plurality of first drivers may be configured to provide the light of the first color.

In an embodiment, the second dummy light emitting element of each of the plurality of second drivers may be configured to provide the light of the second color.

In an embodiment, the display device may further include a light blocking layer on the current detection device in the non-display area.

According to some embodiments of the present disclosure, a display device may quantitatively measure a value of a lateral leakage current between the pixels. Therefore, it may be possible to accurately determine whether the display panel is good or bad based on the lateral leakage current.

However, the present disclosure is not limited to the above aspects and features, and the above and additional aspects and features will be set forth, in part, in the detailed description that follows with reference to the drawings, and in part, may be apparent therefrom, or may be learned by practicing one or more of the presented embodiments of the present disclosure.

BRIEF DESCRIPTION OF THE DRAWINGS

The above and other aspects and features of the present disclosure will be more clearly understood from the following detailed description of the illustrative, non-limiting embodiments with reference to the accompanying drawings, in which:

FIG. 9 is a detailed block diagram of a current detection unit according to an embodiment;

DETAILED DESCRIPTION

Figure 1:
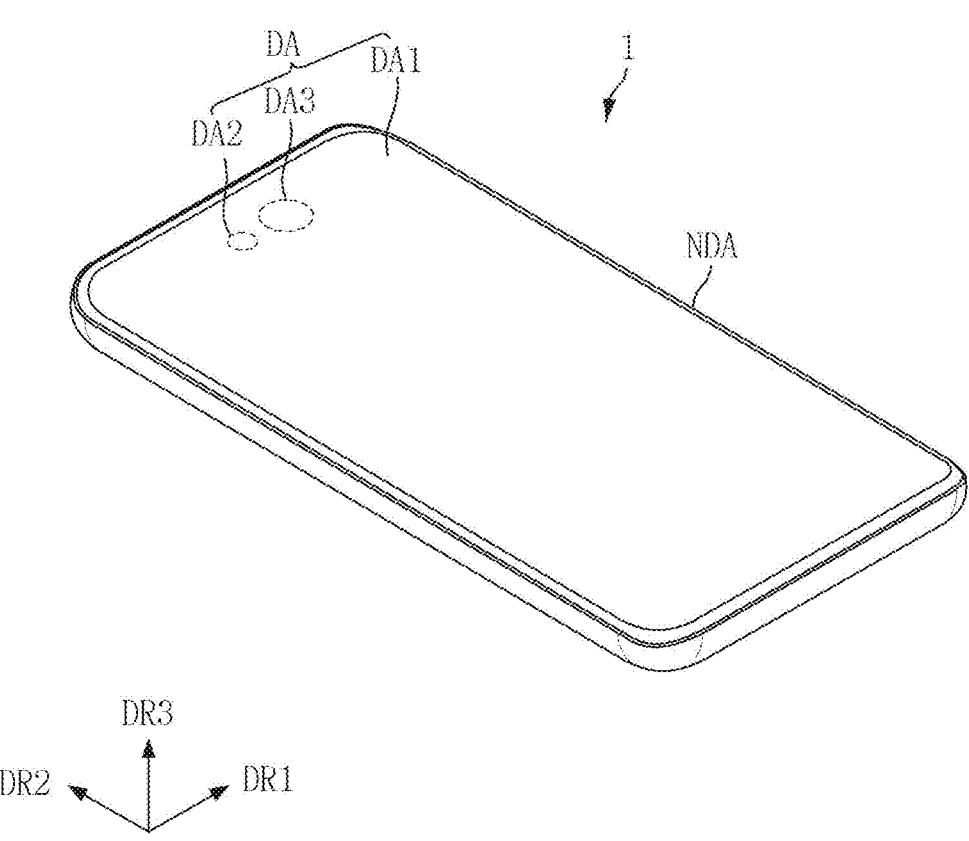
FIG. 1 is a schematic plan view of a display device according to an embodiment.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

Further, as would be understood by a person having ordinary skill in the art, in view of the present disclosure in its entirety, each suitable feature of the various embodiments of the present disclosure may be combined or combined with each other, partially or entirely, and may be technically interlocked and operated in various suitable ways, and each embodiment may be implemented independently of each other or in conjunction with each other in any suitable manner, unless otherwise stated or implied.

In the drawings, the relative sizes, thicknesses, and ratios of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

Further, it should be expected that the shapes shown in the figures may vary in practice depending, for example, on tolerances and/or manufacturing techniques. Accordingly, the embodiments of the present disclosure should not be construed as being limited to the specific shapes shown in the figures, and should be construed considering changes in shapes that may occur, for example, as a result of manufacturing. As such, the shapes shown in the drawings may not depict the actual shapes of areas of the device, and the present disclosure is not limited thereto.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a schematic plan view of a display device according to an embodiment.

Referring to FIG. 1, an electronic device 1 displays a moving image or a still image. The electronic device 1 may refer to any suitable electronic device that provides a display screen. Some examples of the electronic device 1 that provides a display screen may include a television, a laptop computer, a monitor, a billboard, an Internet-of-Things device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game machine, a digital camera, a camcorder, and the like.

The electronic device 1 may include a display device (e.g., see 10 in FIG. 2) for providing a display screen. Some examples of the display device may include an inorganic light emitting diode display device, an organic light emitting display device, a quantum dot light emitting display device, a plasma display device, and a field emission display device. Hereinafter, for convenience of illustration, an organic light emitting diode display device may be described in more detail as a representative example of the display device, but the present disclosure is not limited thereto, and other suitable display devices may be applied as needed or desired.

The shape of the electronic device 1 may be variously modified as needed or desired. For example, the electronic device 1 may have any suitable shape, such as a rectangular shape elongated in a horizontal direction, a rectangular shape elongated in a vertical direction, a square shape, a quadrilateral shape with rounded corners (e.g., vertices), other suitable polygonal shapes, a circular shape, an elliptical shape, or the like. The shape of a display area DA of the electronic device 1 may also be similar to the overall shape of the electronic device 1. FIG. 1 illustrates the electronic device 1 having a rectangular shape that is elongated in a second direction DR2.

The electronic device 1 may include the display area DA and a non-display area NDA. The display area DA is an area where a screen may be displayed, and the non-display area NDA is an area where the screen is not displayed. The display area DA may also be referred to as an active region, and the non-display area NDA may also be referred to as a non-active region. The display area DA may occupy or substantially occupy the center of the electronic device 1.

The display area DA may include a first display area DA1, a second display area DA2, and a third display area DA3. The second display area DA2 and the third display area DA3 may be areas in which components for adding various suitable functions to the electronic device 1 are disposed. As such, the second display area DA2 and the third display area DA3 may correspond to a component area.

Figure 2:
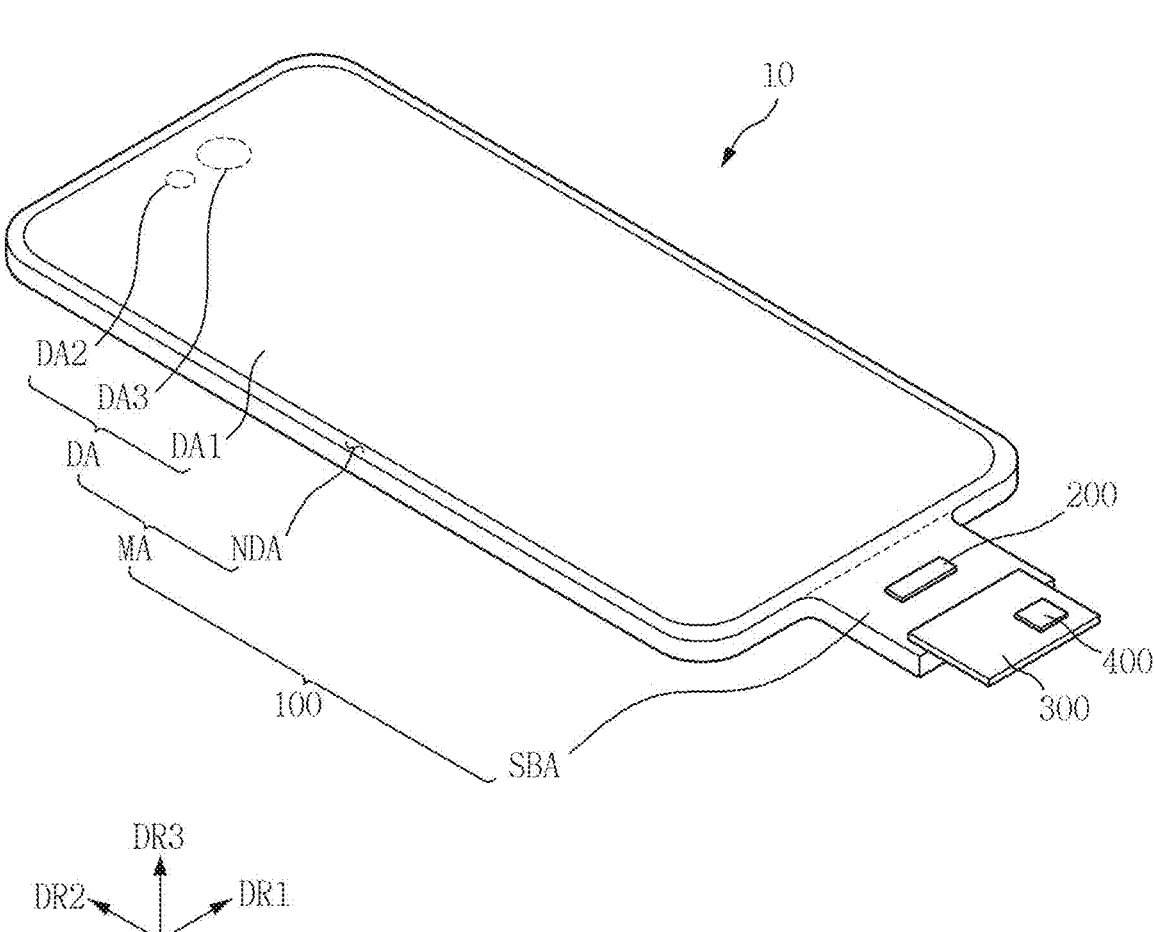
FIG. 2 is a perspective view illustrating a display device included in an electronic device according to an embodiment.

FIG. 2 is a perspective view illustrating a display device included in an electronic device according to an embodiment.

Referring to FIG. 2, the electronic device 1 according to an embodiment may include the display device 10. The display device 10 may provide a screen (e.g., a display screen) displayed by the electronic device 1. The display device 10 may have a planar or substantially planar shape similar to the shape of the electronic device 1. For example, the display device 10 may have a shape similar to a rectangular shape having a short side extending in a first direction DR1 and a long side extending in the second direction DR2. An edge where the short side extending in the first direction DR1 and the long side extending in the second direction DR2 meet each other may be rounded to have a curvature, but the present disclosure is not limited thereto, and the edge may be formed at a right angle. The planar shape of the display device 10 is not limited to a quadrilateral shape, and may be formed in any suitable shape similar to another polygonal shape, a circular shape, an elliptical shape, or the like.

The display device 10 may include a display panel 100, a display driver 200, a circuit board 300, and a touch driver 400.

The display panel 100 may include a main region MA and a sub-region SBA.

The main region MA may include the display area DA including pixels for displaying an image, and the non-display area NDA disposed around the display area DA. The display area DA may include the first display area DA1, the second display area DA2, and the third display area DA3. The display area DA may emit light from a plurality of emission areas or a plurality of opening areas. For example, the display panel 100 may include a pixel circuit including switching elements, a pixel defining layer defining an emission area or an opening area, and a self-light emitting element.

For example, the self-light emitting element may include at least one of an organic light emitting diode (LED) including an organic light emitting layer, a quantum dot LED including a quantum dot light emitting layer, an inorganic LED including an inorganic semiconductor, or a micro LED, but the present disclosure is not limited thereto.

The non-display area NDA may be an area outside the display area DA. The non-display area NDA may be defined as an edge area of the main region MA of the display panel 100. The non-display area NDA may include a gate driver that supplies gate signals to gate lines, and fan-out lines that connect the display driver 200 to the display area DA.

The sub-region SBA may be a region extending from one side of the main region MA. The sub-region SBA may include a flexible material that may be bent, folded, or rolled. For example, when the sub-region SBA is bent, the sub-region SBA may overlap with the main region MA in a thickness direction (e.g., a third direction DR3). The sub-region SBA may include the display driver 200 and a pad portion connected to the circuit board 300. In another embodiment, the sub-region SBA may be omitted as needed or desired, and the display driver 200 and the pad portion may be disposed in the non-display area NDA.

The display driver 200 may output signals and voltages for driving the display panel 100. The display driver 200 may supply data voltages to data lines. The display driver 200 may supply a power voltage to a power line, and may supply a gate control signal to the gate driver. The display driver 200 may be formed as an integrated circuit (IC), and mounted on the display panel 100 by a chip on glass (COG) method, a chip on plastic (COP) method, or an ultrasonic bonding method. For example, the display driver 200 may be disposed in the sub-region SBA, and may overlap with the main region MA in the thickness direction by bending of the sub-region SBA. As another example, the display driver 200 may be mounted on the circuit board 300.

The circuit board 300 may be attached to the pad portion of the display panel 100 by using an anisotropic conductive film (ACF). Lead lines of the circuit board 300 may be electrically connected to the pad portion of the display panel 100. The circuit board 300 may be a flexible printed circuit board, a printed circuit board, or a flexible film such as a chip on film.

The touch driver 400 may be mounted on the circuit board 300. The touch driver 400 may be connected to a touch sensing unit (e.g., a touch sensor, a touch sensing layer, or a touch sensing panel) of the display panel 100. The touch driver 400 may supply a touch driving signal to a plurality of touch electrodes of the touch sensing unit, and may sense an amount of change in a capacitance between the plurality of touch electrodes. For example, the touch driving signal may be a pulse signal having a suitable frequency (e.g., a predetermined frequency). The touch driver 400 may determine whether or not an input is made, and may calculate input coordinates based on an amount of change in a capacitance between the plurality of touch electrodes. The touch driver 400 may be formed as an integrated circuit (IC).

Figure 3:
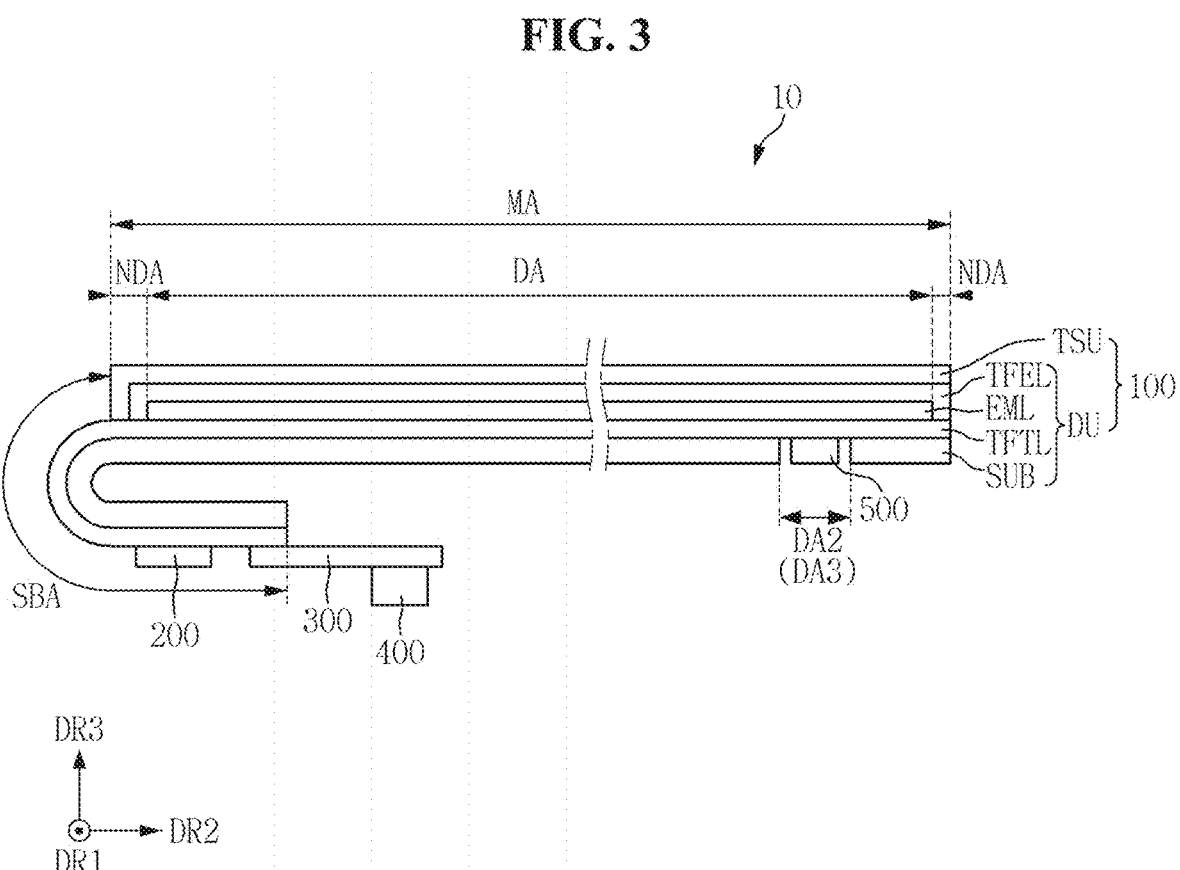
FIG. 3 is a cross-sectional view of the display device of FIG. 2 viewed from the side.

FIG. 3 is a cross-sectional view of the display device of FIG. 2 viewed from the side.

Figure 6:
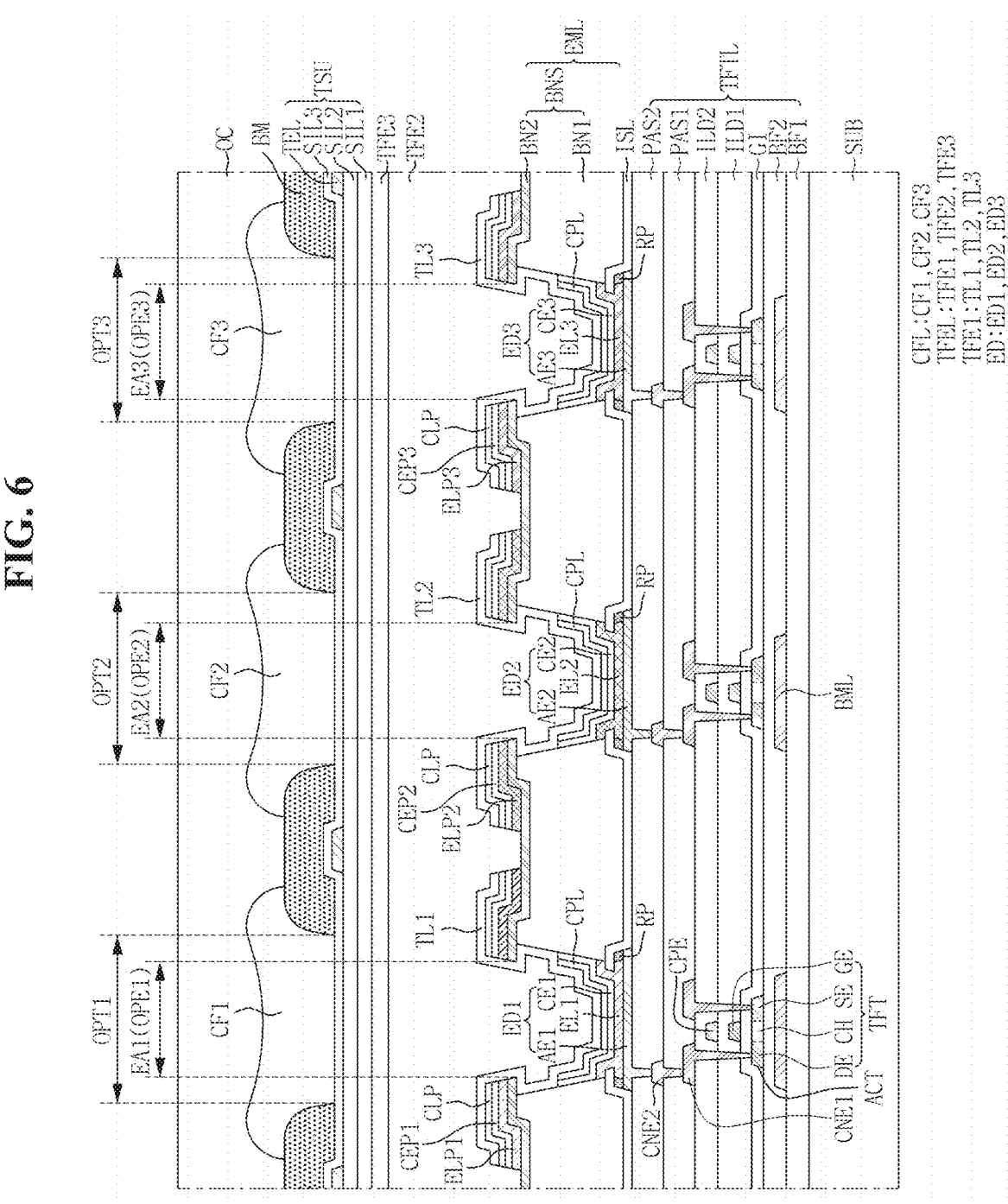
FIG. 6 is a cross-sectional view illustrating a part of a display device according to an embodiment.

Referring to FIG. 3, the display panel 100 may include a display layer DU, a touch sensing layer TSU, and a color filter layer CFL (e.g., see FIG. 6). The display layer DU may include a substrate SUB, a thin film transistor layer TFTL, a light emitting element layer EML, and a thin film encapsulation layer TFEL.

The substrate SUB may be a base substrate or a base member. The substrate SUB may be a flexible substrate that may be bent, folded, or rolled. For example, the substrate SUB may include a polymer resin such as polyimide (PI), but the present disclosure is not limited thereto. In another embodiment, the substrate SUB may include a glass material or a metal material.

The thin film transistor layer TFTL may be disposed on the substrate SUB. The thin film transistor layer TFTL may include a plurality of thin film transistors constituting a pixel circuit of the pixels. The thin film transistor layer TFTL may further include gate lines, data lines, power lines, gate control lines, fan-out lines that connect the display driver 200 to the data lines, and lead lines that connect the display driver 200 to the pad portion. Each of the thin film transistors may include a semiconductor region, a source electrode, a drain electrode, and a gate electrode. For example, when the gate driver is formed on one side of the non-display area NDA of the display panel 100, the gate driver may include a plurality of thin film transistors.

The thin film transistor layer TFTL may be disposed in the display area DA, the non-display area NDA, and the sub-region SBA. The thin film transistors, the gate lines, the data lines, and the power lines for each of the pixels of the thin film transistor layer TFTL may be disposed in the display area DA. Gate control lines and fan-out lines of the thin film transistor layer TFTL may be disposed in the non-display area NDA. The lead lines of the thin film transistor layer TFTL may be disposed in the sub-region SBA.

The light emitting element layer EML may be disposed on the thin film transistor layer TFTL. The light emitting element layer EML may include a plurality of light emitting elements, each including a first electrode, a second electrode, and a light emitting layer to emit light, and a pixel defining layer defining the pixels. The plurality of light emitting elements of the light emitting element layer EML may be disposed in the display area DA.

In an embodiment, the light emitting layer may be an organic light emitting layer including an organic material. The light emitting layer may include a hole transporting layer, an organic light emitting layer, and an electron transporting layer. When the first electrode receives a voltage through the thin film transistor of the thin film transistor layer TFTL and the second electrode receives a cathode voltage, holes and electrons may be transferred to the organic light emitting layer through the hole transporting layer and the electron transporting layer, respectively, and may be combined with each other to emit light in the organic light emitting layer.

In another embodiment, the light emitting elements may include a quantum dot light emitting diode including a quantum dot light emitting layer, an inorganic light emitting diode including an inorganic semiconductor, or a micro light emitting diode.

The display device 10 according to an embodiment may include a plurality of color filters CF1, CF2, and CF3 (e.g., see FIGS. 5 and 6) disposed on the light emitting elements of the light emitting element layer EML. Each of the color filters CF1, CF2, and CF3 may selectively transmit light of a desired wavelength (e.g., a specific or predetermined wavelength), and may block or absorb light of a different wavelength. The color filters CF1, CF2, and CF3 may absorb a part of the light coming from the outside of the display device 10 to reduce a reflected light due to external light. Accordingly, the color filter may prevent or substantially prevent color distortion caused by reflection of the external light.

Because the color filters CF1, CF2, and CF3 are disposed on the light emitting elements, the display device 10 may not use a separate substrate for the color filter. Accordingly, the thickness of the display device 10 may be reduced (e.g., may be relatively small).

The thin film encapsulation layer TFEL may cover the top surface and the side surface of the light emitting element layer EML, and may protect the light emitting element layer EML. The thin film encapsulation layer TFEL may include at least one inorganic layer and at least one organic layer for encapsulating the light emitting element layer EML.

The touch sensing layer TSU may be disposed on the encapsulation layer TFEL. The touch sensing layer TSU may include a plurality of touch electrodes for sensing a user's touch in a capacitive manner, and touch lines connecting the plurality of touch electrodes to the touch driver 400. For example, the touch sensing layer TSU may sense the user's touch by using a mutual capacitance method or a self-capacitance method.

In another embodiment, the touch sensing layer TSU may be disposed on a separate substrate disposed on the display layer DU. In this case, the substrate supporting the touch sensing layer TSU may be a base member that encapsulates the display layer DU.

The plurality of touch electrodes of the touch sensing layer TSU may be disposed in a touch sensor area overlapping with the display area DA. The touch lines of the touch sensing layer TSU may be disposed in a touch peripheral area that overlaps with the non-display area NDA.

In some embodiments, the display device 10 may further include an optical device 500. The optical device 500 may be disposed in the second display area DA2 or the third display area DA3. The optical device 500 may emit or receive light in infrared, ultraviolet, and/or visible light bands. For example, the optical device 500 may be an optical sensor that detects light incident on the display device 10, such as a proximity sensor, an illuminance sensor, and/or a camera sensor (e.g., an image sensor).

The color filter layer CFL (e.g., see FIG. 6) may be disposed on the thin film encapsulation layer TFEL. The color filter layer CFL may include a plurality of color filters corresponding to the plurality of emission areas, respectively. Each of the color filters may selectively transmit light of a desired wavelength (e.g., a specific or predetermined wavelength), and may block or absorb light of a different wavelength. The color filter layer CFL may absorb a part of the light coming from the outside of the display device 10 to reduce a reflected light due to external light. Accordingly, the color filter layer CFL may prevent or substantially prevent a color distortion that may be caused by a reflection of the external light.

Because the color filter layer CFL may be directly disposed on the thin film encapsulation layer TFEL, the display device 10 may not use a separate substrate for the color filter layer CFL. Accordingly, the thickness of the display device 10 may be reduced (e.g., may be relatively small).

Figure 4:
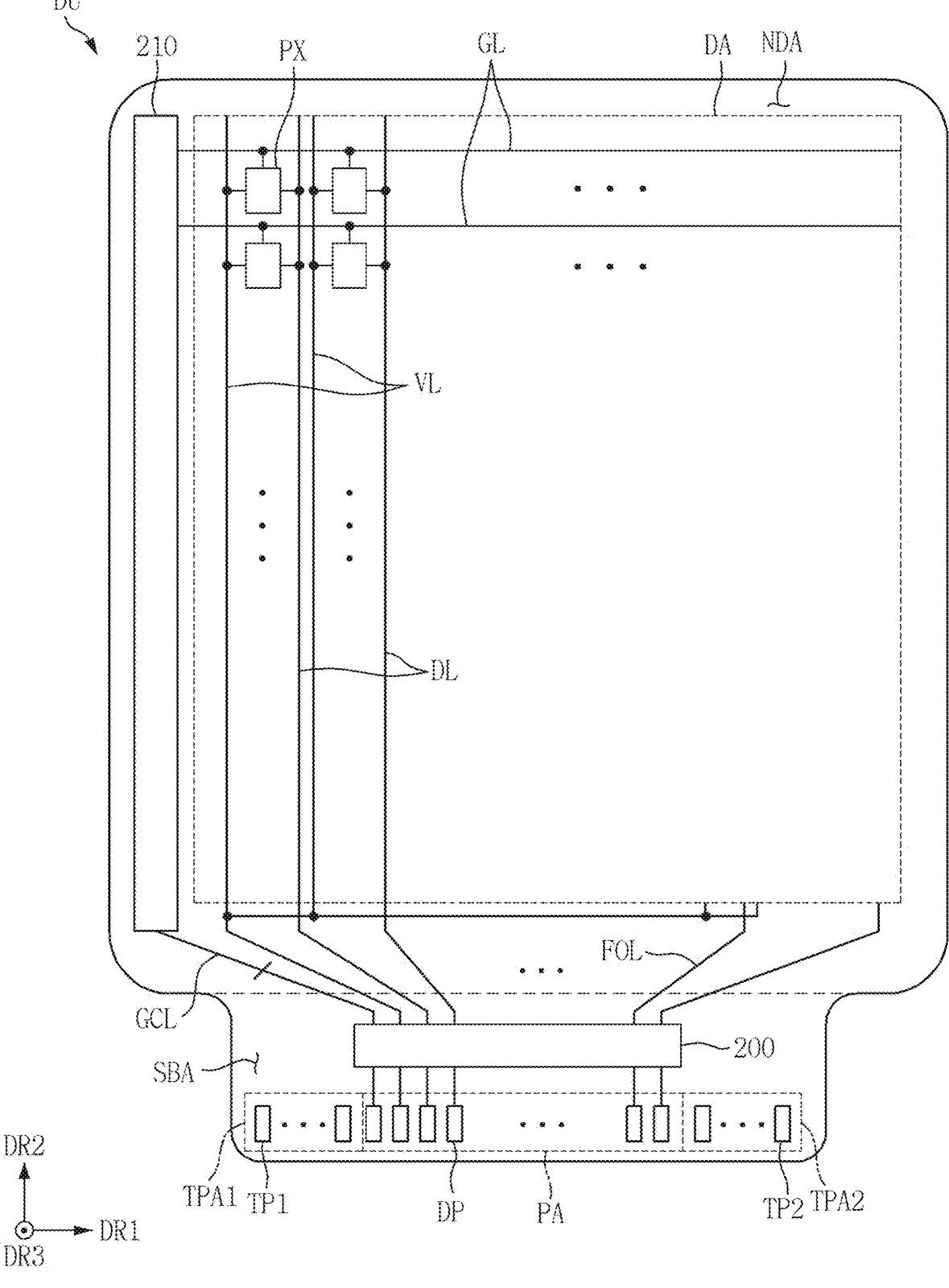
FIG. 4 is a plan view illustrating a display layer of a display device according to an embodiment.

FIG. 4 is a plan view illustrating a display layer of a display device according to an embodiment.

Referring to FIG. 4, the display layer DU may include the display area DA and the non-display area NDA.

The display area DA may be disposed at the center of the display panel 100. A plurality of pixels PX, a plurality of gate lines GL, a plurality of data lines DL, and a plurality of power lines VL may be disposed in the display area DA. Each of the plurality of pixels PX may be defined as a minimum unit that emits light.

The plurality of gate lines GL may supply the gate signals received from the gate driver 210 to the plurality of pixels PX. The plurality of gate lines GL may extend in the first direction DR1, and may be spaced apart from each other in the second direction DR2 crossing or intersecting the first direction DR1.

The plurality of data lines DL may supply the data voltages received from the display driver 200 to the plurality of pixels PX. The plurality of data lines DL may extend in the second direction DR2, and may be spaced apart from each other in the first direction DR1.

The plurality of power lines VL may supply the power voltage received from the display driver 200 to the plurality of pixels PX. The power voltage may be at least one of a driving voltage, an initialization voltage, a reference voltage, or a low potential voltage (e.g., a common voltage). The plurality of power lines VL may extend in the second direction DR2, and may be spaced apart from each other in the first direction DR1.

The non-display area NDA may surround (e.g., around a periphery of) the display area DA. The gate driver 210, fan-out lines FOL, and gate control lines GCL may be disposed in the non-display area NDA. The gate driver 210 may generate a plurality of gate signals based on the gate control signal, and may sequentially supply the plurality of gate signals to the plurality of gate lines GL according to a suitable order (e.g., a set or predetermined order).

The fan-out lines FOL may extend from the display driver 200 to the display area DA. The fan-out lines FOL may supply the data voltage received from the display driver 200 to the plurality of data lines DL.

The gate control line GCL may extend from the display driver 200 to the gate driver 210. The gate control line GCL may supply the gate control signal received from the display driver 200 to the gate driver 210.

The sub-region SBA may include the display driver 200, a pad area PA, and first and second touch pad areas TPA1 and TPA2.

The display driver 200 may output signals and voltages for driving the display panel 100 to the fan-out lines FOL. The display driver 200 may supply a data voltage to the data line DL through the fan-out lines FOL. The data voltage may be supplied to the plurality of pixels PX, and the luminance of the plurality of pixels PX may be controlled. The display driver 200 may supply the gate control signal to the gate driver 210 through the gate control line GCL.

The pad area PA, the first touch pad area TPA1, and the second touch pad area TPA2 may be disposed at an edge of the sub-region SBA. The pad area PA, the first touch pad area TPA1, and the second touch pad area TPA2 may be electrically connected to the circuit board 300 by using a suitable material, such as a self-assembly anisotropic conductive paste (SAP) or an anisotropic conductive film.

The pad area PA may include a plurality of display pad portions DP. The plurality of display pad portions DP may be connected to a graphic system through the circuit board 300. The plurality of display pad portions DP may be connected to the circuit board 300 to receive digital video data, and may supply the digital video data to the display driver 200.

Figure 5:
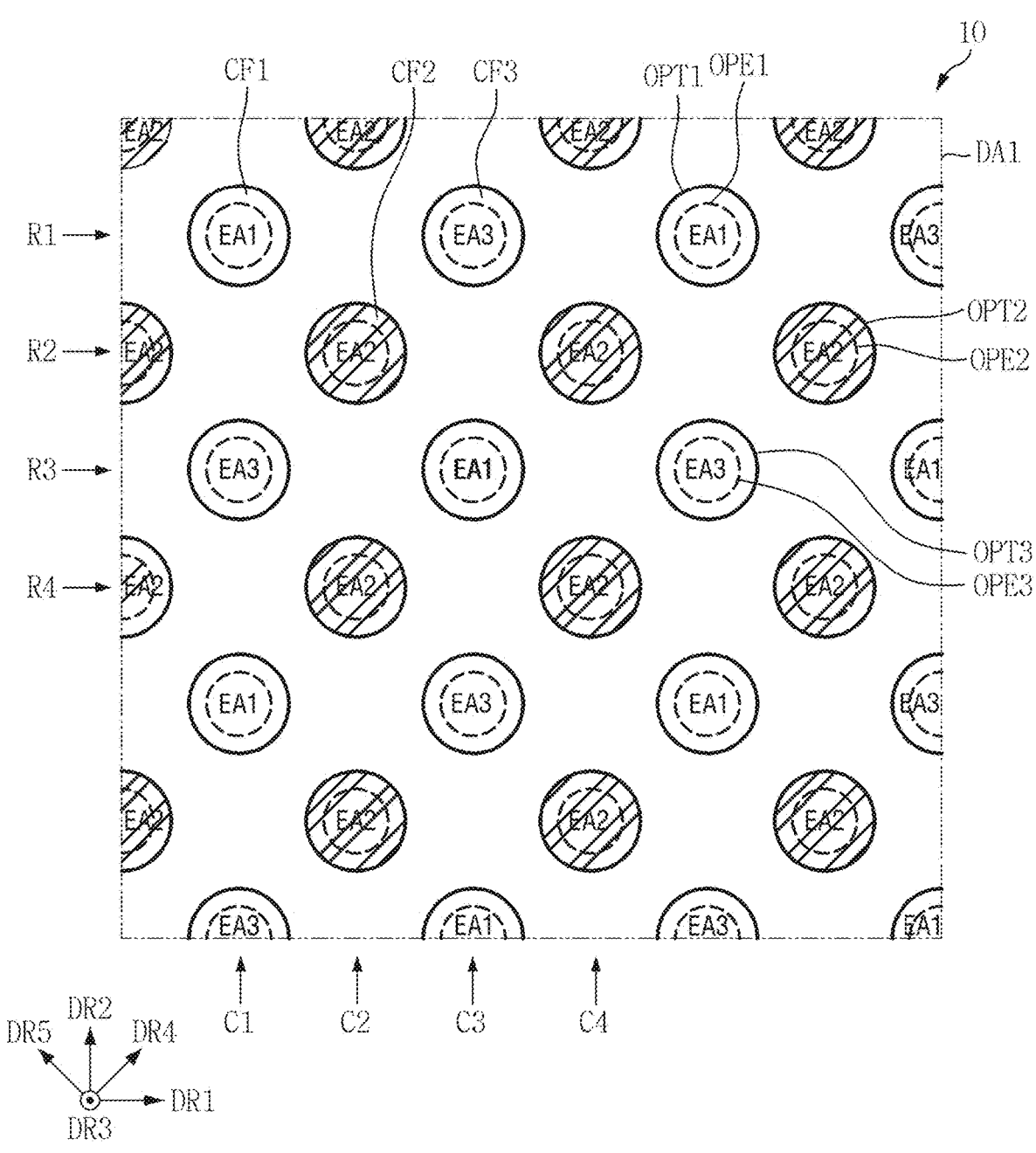
FIG. 5 is a plan view of a disposition of color filters and emission areas in a display area of a display device according to an embodiment.

FIG. 5 is a plan view of a disposition of the color filters and the emission areas in the display area of the display device according to an embodiment.

Referring to FIG. 5, the display device 10 may include a plurality of emission areas EA1, EA2, and EA3 disposed in the display area DA. The display area DA shown in FIG. 5 may correspond to the first display area DA1, and the plurality of emission areas EA1, EA2, and EA3 may be disposed in the first display area DA1. However, the plurality of emission areas EA1, EA2, and EA3 may also be disposed in the second display area DA2 and the third display area DA3 of the display area DA.

The emission areas EA1, EA2, and EA3 may include a first emission area EA1, a second emission area EA2, and a third emission area EA3 for emitting light of different colors from each other. The first to third emission areas EA1, EA2, and EA3 may emit red, green, and blue light, respectively. The color of the light emitted from each of the emission areas EA1, EA2, and EA3 may be different depending on the kind of light emitting elements ED1, ED2, and ED3 (e.g., see FIG. 6) disposed at (e.g., in or on) the light emitting element layer EML to be described in more detail below. In an embodiment, the first emission area EA1 may emit a first light of a red color, the second emission area EA2 may emit a second light of a green color, and the third emission area EA3 may emit a third light of a blue color. However, the present disclosure is not limited thereto.

The plurality of emission areas EA1, EA2, and EA3 may be disposed in a diamond-shaped arrangement (e.g., a PEN-TILE® arrangement, such as a diamond PENTILE® arrangement, PENTILE® being a duly registered trademark of Samsung Display Co., Ltd.). For example, the first emission area EA1 and the third emission area EA3 may be spaced apart from each other in the first direction DR1, and may be alternately disposed with each other along the first direction DR1 and the second direction DR2. In the arrangement of the emission areas EA1, EA2, and EA3, the first emission area EA1 and the third emission area EA3 may be alternately disposed along the first direction DR1 in a first row R1 and a third row R3. In a first column C1 and a third column C3, the first emission area EA1 and the third emission area EA3 may be alternately disposed along the second direction DR2.

The second emission area EA2 may be spaced apart from another adjacent second emission area EA2 along the first direction DR1 and the second direction DR2, and may be spaced apart from an adjacent first emission area EA1 and an adjacent third emission area EA3 in a fourth direction DR4 or a fifth direction DR5. The plurality of second emission areas EA2 may be repeatedly disposed along the first direction DR1 and the second direction DR2, and the second emission area EA2 and the first emission area EA1, or the second emission area EA2 and the third emission area EA3 may be alternately disposed along the fourth direction DR4 or the fifth direction DR5. In the arrangement of the emission areas EA1, EA2, and EA3, the second emission area EA2 may be repeatedly disposed along the first direction DR1 in a second row R2 and a fourth row R4, and the second emission area EA2 may be repeatedly disposed along the second direction DR2 in a second column C2 and a fourth column C4.

The first to third emission areas EA1, EA2, and EA3 may be defined by a plurality of openings OPE1, OPE2, and OPE3, respectively, formed in a bank structure BNS (e.g., see FIG. 6) of the light emitting element layer EML which will be described in more detail below. For example, the first emission area EA1 may be defined by the first opening OPE1 of the pixel defining layer, the second emission area EA2 may be defined by the second opening OPE2 of the pixel defining layer, and the third emission area EA3 may be defined by the third opening OPE3 of the pixel defining layer.

The areas of the emission areas EA1, EA2, and EA3 may vary according to the sizes of the openings OPE1, OPE2, and OPE3 of the bank structure. The intensity of light emitted from the corresponding emission areas EA1, EA2, and EA3 may vary according to the areas of the emission areas EA1, EA2, and EA3, and the areas of the emission areas EA1, EA2, and EA3 may be adjusted to control the color of the screen displayed on the display device 10 or the electronic device 1. In an embodiment, the areas or sizes of the first to third emission areas EA1, EA2, and EA3 may be the same or substantially the same as each other. In the embodiment illustrated in FIG. 5, the first emission area EA1, the second emission area EA2, and the third emission area EA3 may have the same or substantially the same area as each other or the same or substantially the same diameter as each other.

However, the present disclosure is not limited thereto. The areas of the emission areas EA1, EA2, and EA3 may be variously adjusted as needed or desired according to the color of the screen desired by the display device 10 and the electronic device 1. In addition, the areas of the emission areas EA1, EA2, and EA3 may be related to a light efficiency and the lifespan of the light emitting element ED, and may have a trade-off relation with the reflection by external light. The areas of the emission areas EA1, EA2, and EA3 may be adjusted in consideration of the above factors. For example, in the display device 10, the area of the third emission area EA3 may be greater than the areas of the first emission area EA1 and the second emission area EA2, and the area of the first emission area EA1 may be greater than the area of the second emission area EA2.

In the display device 10 having the disposition of the emission areas EA1, EA2, and EA3 shown in FIG. 5, one first emission area EA1, two second emission areas EA2, and one third emission area EA3 that are adjacent to each other may form one pixel group. One pixel group may include the emission areas EA1, EA2, and EA3 emitting light of different colors from each other to express a white gray scale. However, the present disclosure is not limited thereto, and the combination of the emission areas EA1, EA2, and EA3 constituting one pixel group may be variously modified depending on the arrangement of the emission areas EA1, EA2, and EA3, the color of the light emitted from the emission areas EA1, EA2, and EA3, and the like.

The display device 10 may include the plurality of color filters CF1, CF2, and CF3 disposed on the emission areas EA1, EA2, and EA3. The plurality of color filters CF1, CF2, and CF3 may be disposed to correspond to the emission areas EA1, EA2, and EA3, respectively. For example, the color filters CF1, CF2, and CF3 may be disposed in the emission areas EA1, EA2, and EA3, or a plurality of opening holes OPT1, OPT2, and OPT3 of a light blocking layer BM disposed to correspond to the openings OPE1, OPE2, and OPE3, respectively. The opening holes OPT1, OPT2, and OPT3 of the light blocking layer may be formed to overlap with the openings OPE1, OPE2, and OPE3, and a light exit area from which the light emitted from the emission areas EA1, EA2, and EA3 is emitted may be formed. The color filters CF1, CF2, and CF3 may have areas greater than those of the openings OPE1, OPE2, and OPE3, respectively, and the color filters CF1, CF2, and CF3 may completely cover the light exit area formed by the opening holes OPT1, OPT2, and OPT3 of the light blocking layer BM, respectively.

The color filters CF1, CF2, and CF3 may include a first color filter CF1, a second color filter CF2, and a third color filter CF3 disposed to correspond to the different emission areas EA1, EA2, and EA3, respectively. The color filters CF1, CF2, and CF3 may include a colorant, such as a dye or a pigment, that absorbs light in a wavelength band other than a desired wavelength band (e.g., a specific or predetermined wavelength band), and may be disposed to correspond to the color of the light emitted from the emission areas EA1, EA2, and EA3. For example, the first color filter CF1 may be a red color filter that is disposed to overlap with the first emission area EA1, and transmits only the first light of the red color. The second color filter CF2 may be a green color filter that is disposed to overlap with the second emission area EA2, and transmits only the second light of the green color. The third color filter CF3 may be a blue color filter that is disposed to overlap with the third emission area EA3, and transmits only the third light of the blue color.

Similarly to the disposition of the emission areas EA1, EA2, and EA3, the color filters CF1, CF2, and CF3 may be disposed in a diamond-shaped arrangement (e.g., the PEN-TILE® arrangement). For example, the first color filter CF1 and the third color filter CF3 may be alternately disposed along the first direction DR1 and the second direction DR2. In the arrangement of the color filters CF1, CF2, and CF3, the first color filter CF1 and the third color filter CF3 may be alternately disposed along the first direction DR1 in the first row R1 and the third row R3. In the first column C1 and the third column C3, the first color filter CF1 and the third color filter CF3 may be alternately disposed along the second direction DR2.

The second color filter CF2 and another adjacent second color filter CF2 may be arranged along the first direction DR1 and the second direction DR2, and the second color filter CF2 and an adjacent first color filter CF1 and an adjacent third color filter CF3 may be arranged along the fourth direction DR4 or the fifth direction DR5. The plurality of second color filters CF2 may be repeatedly disposed along the first direction DR1 and the second direction DR2, and the second color filter CF2 and the first color filter CF1, or the second color filter CF2 and the third color filter CF3 may be alternately disposed along the fourth direction DR4 or the fifth direction DR5. In the arrangement of the color filters CF1, CF2, and CF3, the second color filter CF2 may be repeatedly disposed along the first direction DR1 in the second row R2 and the fourth row R4, and the second color filter CF2 may be repeatedly disposed along the second direction DR2 in the second column C2 and the fourth column C4.

Figure 7:
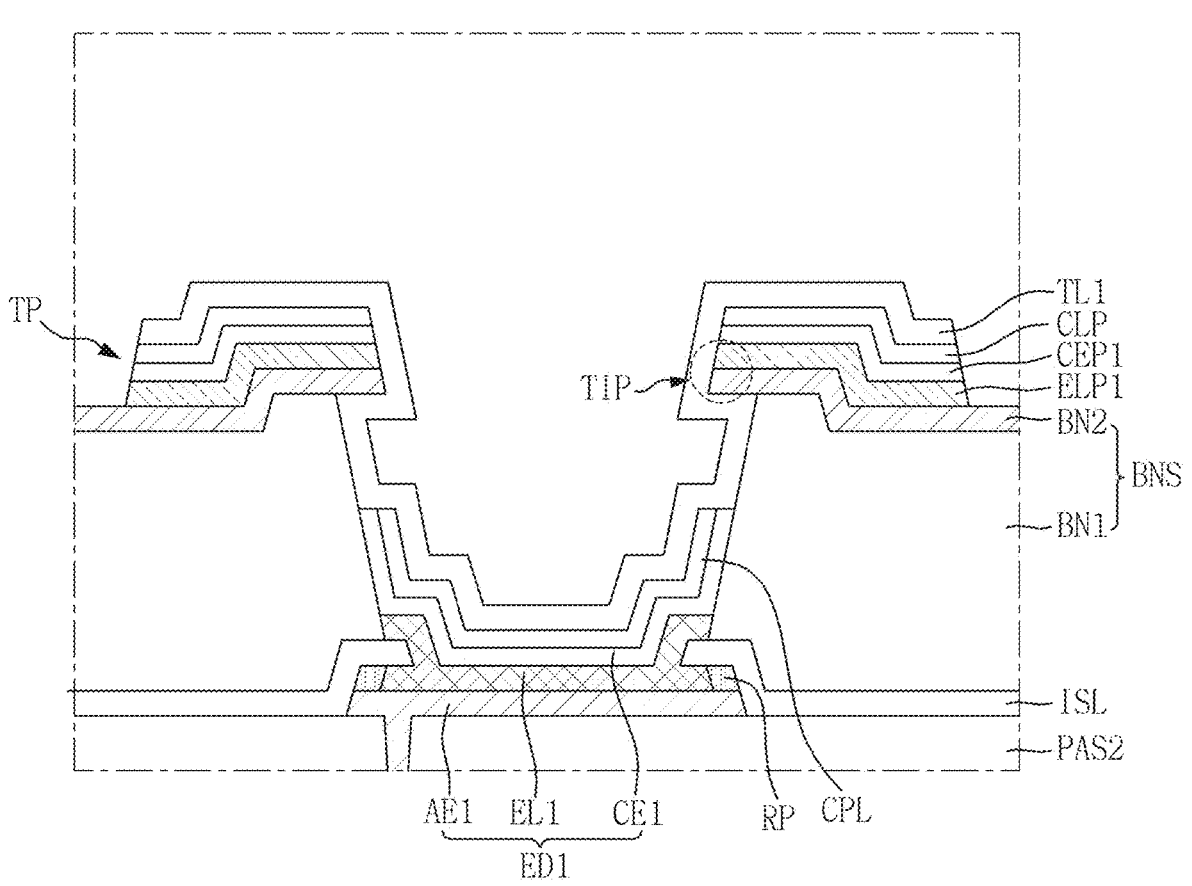
FIG. 7 is an enlarged view illustrating a first emission area of FIG. 6.

FIG. 6 is a cross-sectional view illustrating a part of a display device according to an embodiment. FIG. 7 is an enlarged view illustrating the first emission area of FIG. 6. FIG. 6, which is a partial cross-sectional view of the display device 10, illustrates a cross section of the substrate SUB, the thin film transistor layer TFTL, the light emitting element layer EML, and the thin film encapsulation layer TFEL of the display layer DU, the touch sensing layer TSU, and the color filter layer CFL. FIG. 7 illustrates a first light emitting element ED1 disposed in the first emission area EA1 in FIG. 6, and a part of the bank structure BNS adjacent thereto.

Referring to FIGS. 6 and 7 as well as to FIG. 5, the display panel 100 of the display device 10 may include the display layer DU. The display layer DU may include the substrate SUB, the thin film transistor layer TFTL, the light emitting element layer EML, and the thin film encapsulation layer TFEL. The display panel 100 may include the light blocking layer BM disposed on the thin film encapsulation layer TFEL, and the color filters CF1, CF2, and CF3 of the color filter layer CFL may be disposed on the light blocking layer BM.

The substrate SUB may be a base substrate or a base member. The substrate SUB may be a flexible substrate that may be bent, folded, or rolled. For example, the substrate SUB may include a polymer resin such as polyimide (PI), but the present disclosure is not limited thereto. As another example, the substrate SUB may include a glass material or a metal material.

The thin film transistor layer TFTL may include a first buffer layer BF1, a lower metal layer BML, a second buffer layer BF2, a thin film transistor TFT, a gate insulating layer GI, a first interlayer insulating layer ILD1, a capacitor electrode CPE, a second interlayer insulating layer ILD2, a first connection electrode CNE1, a first passivation layer PAS1, a second connection electrode CNE2, and a second passivation layer PAS2.

The first buffer layer BF1 may be disposed on the substrate SUB. The first buffer layer BF1 may include an inorganic layer capable of preventing or substantially preventing penetration of air and/or moisture. For example, the first buffer layer BF1 may include a plurality of inorganic layers that are alternately stacked.

The lower metal layer BML may be disposed on the first buffer layer BF1. For example, the lower metal layer BML may be formed as a single layer or multiple layers including (e.g., made of) any one or more of molybdenum (Mo), aluminum (Al), chromium (Cr), gold (Au), titanium (Ti), nickel (Ni), neodymium (Nd), copper (Cu), or a suitable alloy thereof.

The second buffer layer BF2 may cover the first buffer layer BF1 and the lower metal layer BML. The second buffer layer BF2 may include an inorganic layer capable of preventing or substantially preventing penetration of air and/or moisture. For example, the second buffer layer BF2 may include a plurality of inorganic layers that are alternately stacked.

The thin film transistor TFT may be disposed on the second buffer layer BF2. The thin film transistor TFT may constitute a pixel circuit of a corresponding one of the plurality of pixels. For example, the thin film transistor TFT may be a switching transistor or a driving transistor of the pixel circuit. The thin film transistor TFT may include a channel region CH, a source electrode SE, a drain electrode DE, and a gate electrode GE.

An active layer ACT may be disposed on the second buffer layer BF2. The active layer ACT may overlap with the lower metal layer BML and the gate electrode GE in the thickness direction, and may be insulated from the gate electrode GE by the gate insulating layer GI. A part of the active layer ACT may be made into a conductor to form the source electrode SE and the drain electrode DE.

The gate electrode GE may be disposed on the gate insulating layer GI. The gate electrode GE may overlap with the active layer ACT with the gate insulating layer GI interposed therebetween. A region of the active layer ACT overlapping with the gate electrode GE may be the channel region CH.

The gate insulating layer GI may be disposed on the active layer ACT. For example, the gate insulating layer GI may cover the active layer ACT and the second buffer layer BF2 to insulate the gate electrode GE from the active layer ACT. The gate insulating layer GI may include a contact hole through which the first connection electrode CNE1 passes.

The first interlayer insulating layer ILD1 may cover the gate electrode GE and the gate insulating layer GI. The first interlayer insulating layer ILD1 may include a contact hole through which the first connection electrode CNE1 passes. The contact hole of the first interlayer insulating layer ILD1 may be connected to the contact hole of the gate insulating layer GI and the contact hole of the second interlayer insulating layer ILD2.

The capacitor electrode CPE may be disposed on the first interlayer insulating layer ILD1. The capacitor electrode CPE may overlap with the gate electrode GE in the thickness direction. The capacitor electrode CPE and the gate electrode GE may form a capacitance.

The second interlayer insulating layer ILD2 may cover the capacitor electrode CPE and the first interlayer insulating layer ILD1. The second interlayer insulating layer ILD2 may include a contact hole through which the first connection electrode CNE1 passes. The contact hole of the second interlayer insulating layer ILD2 may be connected to the contact hole of the first interlayer insulating layer ILD1 and the contact hole of the gate insulating layer GI.

The first connection electrode CNE1 may be disposed on the second interlayer insulating layer ILD2. The first connection electrode CNE1 may electrically connect the drain electrode DE of the thin film transistor TFT to the second connection electrode CNE2. The first connection electrode CNE1 may be inserted into the contact hole provided in the second interlayer insulating layer ILD2, the first interlayer insulating layer ILD1, and the gate insulating layer GI to be in contact with the drain electrode DE of the thin film transistor TFT.

The first passivation layer PAS1 may cover the first connection electrode CNE1 and the second interlayer insulating layer ILD2. The first passivation layer PAS1 may protect the thin film transistor TFT. The first passivation layer PAS1 may include a contact hole through which the second connection electrode CNE2 passes.

The second connection electrode CNE2 may be disposed on the first passivation layer PAS1. The second connection electrode CNE2 may electrically connect the first connection electrode CNE1 to a corresponding one of the pixel electrodes AE1, AE2, and AE3 of the light emitting element ED. The second connection electrode CNE2 may be inserted into the contact hole formed in the first passivation layer PAS1 to be in contact with the first connection electrode CNE1.

The second passivation layer PAS2 may cover the second connection electrode CNE2 and the first passivation layer PAS1. The second passivation layer PAS2 may include contact holes through which the pixel electrodes AE1, AE2, and AE3 of the light emitting elements ED pass.

The light emitting element layer EML may be disposed on the thin film transistor layer TFTL. The light emitting element layer EML may include the light emitting element ED and the plurality of bank structures BNS. The light emitting element ED may include the pixel electrodes AE1, AE2, and AE3, light emitting layers EL1, EL2, and EL3, and common electrodes CE1, CE2, and CE3.

The display device 10 may include the plurality of emission areas EA1, EA2, and EA3 disposed in the display area DA. The emission areas EA1, EA2, and EA3 may include the first emission area EA1, the second emission area EA2, and the third emission area EA3 for emitting light of different colors from each other. The first to third emission areas EA1, EA2, and EA3 may emit red, green, and blue light, respectively, and the color of the light emitted from each of the emission areas EA1, EA2, and EA3 may be different depending on the kind of the light emitting element ED disposed at (e.g., in or on) the light emitting element layer EML. In an embodiment, the first emission area EA1 may emit the first light of a red color, the second emission area EA2 may emit the second light of a green color, and the third emission area EA3 may emit the third light of a blue color. However, the present disclosure is not limited thereto.

The first to third emission areas EA1, EA2, and EA3 may be defined by a plurality of openings OPE1, OPE2, and OPE3 formed in the bank structure BNS of the light emitting element layer EML, respectively. For example, the first emission area EA1 may be defined by a first opening OPE1 of the bank structure BNS, the second emission area EA2 may be defined by a second opening OPE2 of the bank structure BNS, and the third emission area EA3 may be defined by a third opening OPE3 of the bank structure BNS.

In an embodiment, the areas or sizes of the first to third emission areas EA1, EA2, and EA3 may be the same or substantially the same as each other. For example, in the display device 10, the openings OPE1, OPE2, and OPE3 of the bank structures BNS may have the same or substantially the same diameter as each other, and the first emission area EA1, the second emission area EA2, and the third emission area EA3 may have the same or substantially the same area as each other. However, the present disclosure is not limited thereto. In the display device 10, the areas or sizes of the first to third emission areas EA1, EA2, and EA3 may be different from each other. For example, the area of the second emission area EA2 may be greater than the areas of the first emission area EA1 and the third emission area EA3, and the area of the third emission area EA3 may be greater than the area of the first emission area EA1. The intensity of light emitted from the corresponding emission areas EA1, EA2, and EA3 may vary according to the areas of the emission areas EA1, EA2, and EA3, and the areas of the emission areas EA1, EA2, and EA3 may be adjusted to control the color of the screen displayed on the display device 10 or the electronic device 1. Although it is illustrated in the embodiment of FIG. 6 that the emission areas EA1, EA2, and EA3 have the same or substantially the same area as each other, the present disclosure is not limited thereto. The areas of the emission areas EA1, EA2, and EA3 may be freely adjusted according to the color of the screen desired by the display device 10 and the electronic device 1. In addition, the areas of the emission areas EA1, EA2, and EA3 may be related to a light efficiency and the lifespan of the light emitting element ED, and may have a trade-off relation with the reflection by external light. The areas of the emission areas EA1, EA2, and EA3 may be adjusted in consideration of the above factors.

In the display device 10, one first emission area EA1, one second emission area EA2, and one third emission area EA3 that are disposed adjacent to each other may form one pixel group. One pixel group may include the emission areas EA1, EA2, and EA3 for emitting light of different colors from each other to express a white gray scale. However, the present disclosure is not limited thereto, and the combination of the emission areas EA1, EA2, and EA3 constituting one pixel group may be variously modified depending on the arrangement of the emission areas EA1, EA2, and EA3, the color of the light emitted from the emission areas EA1, EA2, and EA3, and the like.

The display device 10 may include a plurality of light emitting elements ED1, ED2, and ED3 disposed in the different emission areas EA1, EA2, and EA3. The light emitting elements ED1, ED2, and ED3 may include the first light emitting element ED1 disposed in the first emission area EA1, the second light emitting element ED2 disposed in the second emission area EA2, and the third light emitting element ED3 disposed in the third emission area EA3. The light emitting elements ED1, ED2, and ED3 may include the pixel electrodes AE1, AE2, and AE3, the light emitting layers EL1, EL2, and EL3, and the common electrodes CE1, CE2, and CE3, and the light emitting elements ED1, ED2, and ED3 disposed in the different emission areas EA1, EA2, and EA3 may emit light of different colors from each other depending on the materials of the light emitting layers EL1, EL2, and EL3. For example, the first light emitting element ED1 disposed in the first emission area EA1 may emit red light of the first color, the second light emitting element ED2 disposed in the second emission area EA2 may emit green light of the second color, and the third light emitting element ED3 disposed in the third emission area EA3 may emit blue light of the third color. The first to third emission areas EA1, EA2, and EA3 constituting one pixel may include the light emitting elements ED1, ED2, and ED3, respectively, for emitting lights of different colors from each other to express a white gray scale.

The pixel electrodes AE1, AE2, and AE3 may be disposed on the second passivation layer PAS2. The pixel electrodes AE1, AE2, and AE3 may be disposed to overlap with any one of the openings OPE1, OPE2, and OPE3 of the bank structure BNS. The pixel electrodes AE1, AE2, and AE3 may be electrically connected to the drain electrode DE of the thin film transistor TFT through the first and second connection electrodes CNE1 and CNE2.

The pixel electrodes AE1, AE2, and AE3 may be disposed in the plurality of emission areas EA1, EA2, and EA3, respectively. The pixel electrodes AE1, AE2, and AE3 may include the first pixel electrode AE1 disposed in the first emission area EA1, the second pixel electrode AE2 disposed in the second emission area EA2, and the third pixel electrode AE3 disposed in the third emission area EA3. The first pixel electrode AE1, the second pixel electrode AE2, and the third pixel electrode AE3 may be disposed to be spaced apart from each other on the second passivation layer PAS2. The pixel electrodes AE1, AE2, and AE3 may be disposed in the different emission areas EA1, EA2, and EA3 to constitute the light emitting elements ED1, ED2, and ED3 for emitting light of different colors from each other, respectively.

An inorganic insulating layer ISL may be disposed on the second passivation layer PAS2 and the pixel electrodes AE1, AE2, and AE3. The inorganic insulating layer ISL may be disposed on the entire or substantially entire second passivation layer PAS2, and may partially overlap with the pixel electrodes AE1, AE2, and AE3 to expose a part of the top surface of each of the pixel electrodes AE1, AE2, and AE3. The inorganic insulating layer ISL may expose the pixel electrodes AE1, AE2, and AE3 at portions overlapping with the openings OPE1, OPE2, and OPE3 of the bank structure BNS, and the light emitting layers EL1, EL2, and EL3 may be directly disposed on the pixel electrodes AE1, AE2, and AE3, respectively. The inorganic insulating layer ISL may include an inorganic insulating material. For example, the inorganic insulating layer ISL may include aluminum oxide, titanium oxide, tantalum oxide, hafnium oxide, zinc oxide, silicon oxide, silicon nitride, and/or silicon oxynitride.

In accordance with an embodiment, the inorganic insulating layer ISL may be disposed on the pixel electrodes AE1, AE2, and AE3, and may be spaced apart from the top surfaces of the pixel electrodes AE1, AE2, and AE3. The inorganic insulating layer ISL may partially overlap with the pixel electrodes AE1, AE2, and AE3 without a direct contact with the top surfaces thereof, and the light emitting layers EL1, EL2, and EL3 of the light emitting elements ED1, ED2, and ED3 may be partially disposed between the inorganic insulating layer ISL and the pixel electrodes AE1, AE2, and AE3. In the manufacturing process of the display device 10, a sacrificial layer may be disposed on the pixel electrodes AE1, AE2, and AE3 before the inorganic insulating layer ISL is formed. The inorganic insulating layer ISL may be disposed to cover a part of the sacrificial layer, and may be spaced apart from the top surfaces of the pixel electrodes AE1, AE2, and AE3 by the removal of the sacrificial layer. Then, in a deposition process of the light emitting layers EL1, EL2, and EL3, the materials forming the light emitting layers EL1, EL2, and EL3 may fill the space between the inorganic insulating layer ISL and the pixel electrodes AE1, AE2, and AE3, and the inorganic insulating layer ISL may be partially disposed on the light emitting layers EL1, EL2, and EL3. However, the inorganic insulating layer ISL may be in direct contact with the side surfaces of the pixel electrodes AE1, AE2, and AE3.

The display device 10 may include the plurality of bank structures BNS disposed on the thin film transistor layer TFTL or the substrate SUB, and including the plurality of openings OPE1, OPE2, and OPE3. The bank structure BNS may have a structure in which bank layers BN1 and BN2 including different materials from each other are sequentially stacked, and may include the plurality of openings OPE1, OPE2, and OPE3 forming the emission areas EA1, EA2, and EA3, respectively. The light emitting elements ED1, ED2, and ED3 of the display device 10 may be disposed to overlap with the openings OPE1, OPE2, and OPE3 of the bank structure BNS.

The bank structure BNS may include the first bank layer BN1 disposed on the inorganic insulating layer ISL, and the second bank layer BN2 disposed on the first bank layer BN1.

In accordance with an embodiment, the first bank layer BN1 and the second bank layer BN2 may include different metal materials from each other, and the bank structure BNS may include a tip TIP in which the second bank layer BN2 protrudes from the first bank layer BN1 toward the openings OPE1, OPE2, and OPE3. In the bank structure BNS, a lateral side of the first bank layer BN1 may have a shape recessed inward from a lateral side of the second bank layer BN2. In the bank structure BNS, the first bank layer BN1 may be thicker than the second bank layer BN2, and the second bank layer BN2 may be relatively thinner, so that the tip TIP may be formed in the manufacturing process. Because the second bank layer BN2 has a shape protruding toward the openings OPE1, OPE2, and OPE3 more than the first bank layer BN1, an undercut may be formed under the tip TIP of the second bank layer BN2 on the inner sidewalls of the openings OPE1, OPE2, and OPE3 of the bank structure BNS.

The sidewall shape of the bank structure BNS may be a structure formed by a difference in etching rates in an etching process due to the different materials of the first bank layer BN1 and the second bank layer BN2. In accordance with an embodiment, the second bank layer BN2 may include a suitable material having an etching rate lower than that of the first bank layer BN1, and the first bank layer BN1 may be further etched in the process of forming the openings OPE1, OPE2, and OPE3 of the bank structure BNS to form the undercut under the tip TIP of the second bank layer BN2. In an embodiment, the first bank layer BN1 may include a metal material having a high electrical conductivity, and the second bank layer BN2 may include a metal material having a low reflectivity. For example, the first bank layer BN1 may include aluminum (AI), and the second bank layer BN2 may include titanium (Ti). The bank structure BNS may have a suitable structure in which Al/Ti layers are stacked on the inorganic insulating layer ISL, and the tip TIP may be formed in the Ti layer of the second bank layer BN2.

The bank structure BNS may include the openings OPE1, OPE2, and OPE3 forming the emission areas EA1, EA2, and EA3, respectively, and the light blocking layer BM may be disposed on the bank structure BNS. The uppermost layer of the bank structure BNS may include a suitable material having a low reflectivity to reduce a reflection of external light. Further, in the bank structure BNS, the first bank layer BN1 may be electrically connected to the common electrodes CE1, CE2, and CE3 of the different light emitting elements ED1, ED2, and ED3. In the light emitting elements ED1, ED2, and ED3 disposed in the different emission areas EA1, EA2, and EA3, the common electrodes CE1, CE2, and CE3 may not be directly connected to each other, but may be electrically connected to each other through the first bank layer BN1.

In the manufacturing process of the display device 10, a mask process may be used to form the pixel defining layer forming the emission areas EA1, EA2, and EA3 using an organic material, or to form the light emitting layers EL1, EL2, and EL3 of the light emitting elements ED1, ED2, and ED3 in the respective emission areas EA1, EA2, and EA3. In order to perform the mask process, the display device 10 may use a structure for mounting a mask, or an unnecessarily large area of the non-display area NDA may be used to control a variation according to the mask process. If such a mask process is minimized or unused, an unnecessary component (e.g., the structure for mounting the mask) may be omitted in the display device 10, and the area of the non-display area NDA for controlling the variation may be minimized or reduced.

The display device 10 according to an embodiment includes the bank structure BNS for forming the emission areas EA1, EA2, and EA3, and the bank structure BNS and the emission areas EA1, EA2, and EA3 may be formed by a deposition and etching process instead of the mask process. Further, the bank structure BNS includes the first bank layer BN1 and the second bank layer BN2 including different metal materials from each other, and have a structure including the tip TIP on the inner sidewalls of the openings OPE1, OPE2, and OPE3, so that it may be possible to separately form the different layers in the different emission areas EA1, EA2, and EA3 even by a deposition process. For example, even when the light emitting layers EL1, EL2, and EL3 of the light emitting elements ED1, ED2, and ED3 and the common electrodes CE1, CE2, and CE3 are formed by a deposition process using no mask, the deposited materials may be disconnected without being connected between the openings OPE1, OPE2, and OPE3 by the tip TIP of the second bank layer BN2 formed on the inner sidewalls of the openings OPE1, OPE2, and OPE3. By a process of forming a material for forming a specific layer on the entire surface of the display device 10 and then removing the layer formed in an undesired region by etching, it may be possible to individually form the different layers in the different emission areas EA1, EA2, and EA3. In the display device 10, the different light emitting elements ED1, ED2, and ED3 may be formed in the different emission areas EA1, EA2, and EA3 by the deposition and etching process without using the mask process, and an unnecessary component in the display device 10 may be omitted to minimize or reduce the area of the non-display area NDA.

The first encapsulation layer TFE1 of the thin film encapsulation layer TFEL may be disposed on the common electrodes CE1, CE2, and CE3 of the light emitting elements ED1, ED2, and ED3. The first encapsulation layer TFE1 may include a first inorganic layer TL1 disposed on the first light emitting element ED1, a second inorganic layer TL2 disposed on the second light emitting element ED2, and a third inorganic layer TL3 disposed on the third light emitting element ED3. The first to third inorganic layers TL1, TL2, and TL3 may be formed on the entire or substantially entire bank structure BNS, and may be disposed to cover (e.g., to only cover) the light emitting elements ED1, ED2, and ED3, organic patterns ELP1, ELP2, and ELP3 described in more detail below, and electrode patterns CEP1, CEP2, and CEP3 in the respective emission areas EA1, EA2, and EA3, without being disposed between the emission areas EA1, EA2, and EA3. The shape of the inorganic layers TL1, TL2, and TL3 may be formed by forming the inorganic layers TL1, TL2, and TL3 to completely cover the bank structure BNS, and then partially patterning the inorganic layers TL1, TL2, and TL3.

The display device 10 may include patterns that are traces of the deposition process and the shape of the bank structure BNS. The patterns may be formed concurrently (e.g., simultaneously or substantially simultaneously) with the light emitting layers EL1, EL2, and EL3 of the light emitting elements ED1, ED2, and ED3 and the common electrodes CE1, CE2, and CE3, and may remain on the bank structure BNS. Hereinafter, the structures of the light emitting layers EL1, EL2, and EL3, the common electrodes CE1, CE2, and CE3, and the patterns will be described in more detail.

The light emitting layers EL1, EL2, and EL3 may be disposed on the pixel electrodes AE1, AE2, and AE3, respectively. The light emitting layers EL1, EL2, and EL3 may be organic light emitting layers including (e.g., made of) an organic material, and may be formed on the pixel electrodes AE1, AE2, and AE3, respectively, by a deposition process. In the light emitting layers EL1, EL2, and EL3, when the thin film transistor TFT applies a desired voltage (e.g., a predetermined voltage) to the pixel electrodes AE1, AE2, and AE3 of the light emitting elements ED1, ED2, and ED3, and the common electrodes CE1, CE2, and CE3 of the light emitting elements ED1, ED2, and ED3 receive a common voltage or a cathode voltage, holes and electrons may move to the light emitting layers EL1, EL2, and EL3 through a hole transporting layer and an electron transporting layer, respectively, and the holes and the electrons may be combined with each other in the light emitting layers EL1, EL2, and EL3 to emit light.

The light emitting layers EL1, EL2, and EL3 may include the first light emitting layer EL1, the second light emitting layer EL2, and the third light emitting layer EL3 disposed in the different emission areas EA1, EA2, and EA3. The first light emitting layer EL1 may be disposed on the first pixel electrode AE1 in the first emission area EA1, the second light emitting layer EL2 may be disposed on the second pixel electrode AE2 in the second emission area EA2, and the third light emitting layer EL3 may be disposed on the third pixel electrode AE3 in the third emission area EA3. The first to third light emitting layers EL1, EL2, and EL3 may be the light emitting layers of the first to third light emitting elements ED1, ED2 and ED3, respectively. The first light emitting layer EL1 may be the light emitting layer for emitting red light of the first color, the second light emitting layer EL2 may be the light emitting layer for emitting green light of the second color, and the third light emitting layer EL3 may be the light emitting layer for emitting blue light of the third color.

In accordance with an embodiment, the light emitting layers EL1, EL2, and EL3 of the light emitting elements ED1, ED2, and ED3 may be partially disposed between the pixel electrodes AE1, AE2, and AE3 and the inorganic insulating layer ISL. The inorganic insulating layer ISL may be disposed on the pixel electrodes AE1, AE2, and AE3, but may be spaced apart from the top surfaces of the pixel electrodes AE1, AE2, and AE3. The deposition process of the light emitting layers EL1, EL2, and EL3 may be performed, such that the material of the light emitting layer is deposited in an inclined direction rather than a direction perpendicular to or substantially perpendicular to the top surface of the substrate SUB. Accordingly, the light emitting layers EL1, EL2, and EL3 may be disposed on the top surfaces of the pixel electrodes AE1, AE2, and AE3, respectively, exposed through the openings OPE1, OPE2, and OPE3 of the bank structure BNS to fill the space between the pixel electrodes AE1, AE2, and AE3 and the inorganic insulating layer ISL.

In the manufacturing process of the display device 10, the sacrificial layer may be disposed between the inorganic insulating layer ISL and the pixel electrodes AE1, AE2, and AE3, and the light emitting layers EL1, EL2, and EL3 may be disposed in a region where the sacrificial layer is partially removed. Accordingly, the bottom surface of the inorganic insulating layer ISL may be spaced apart from the pixel electrodes AE1, AE2, and AE3. However, the sacrificial layer may remain as a partial residual pattern RP in the region between the inorganic insulating layer ISL and the pixel electrodes AE1, AE2, and AE3. The region between the inorganic insulating layer ISL and the pixel electrodes AE1, AE2, and AE3 may be filled with the partial residual pattern RP and the light emitting layers EL1, EL2, and EL3.

The display device 10 according to an embodiment may include the plurality of organic patterns ELP1, ELP2, and ELP3 including the same or substantially the same material as those of the light emitting layers EL1, EL2, and EL3 and disposed on the bank structure BNS. Because the light emitting layers EL1, EL2, and EL3 are formed by a process of depositing a material on the entire or substantially entire surface of the display device 10, the materials forming the light emitting layers EL1, EL2, and EL3 may also be deposited on the bank structure BNS in addition to the openings OPE1, OPE2, and OPE3 of the bank structure BNS.

For example, the display device 10 may include the organic patterns ELP1, ELP2, and ELP3 disposed on the bank structure BNS. The organic patterns ELP1, ELP2, and ELP3 may include the first organic pattern ELP1, the second organic pattern ELP2, and the third organic pattern ELP3 disposed on the second bank layer BN2 of the bank structure BNS.

The first organic pattern ELP1 may include the same material as that of the first light emitting layer EL1 of the first light emitting element ED1. The second organic pattern ELP2 may include the same material as that of the second light emitting layer EL2 of the second light emitting element ED2. The third organic pattern ELP3 may include the same material as that of the third light emitting layer EL3 of the third light emitting element ED3. The organic patterns ELP1, ELP2, and ELP3 may be formed in the same process as the process of forming the light emitting layers EL1, EL2, and EL3 including the same material as those of the organic patterns ELP1, ELP2, and ELP3.

The first organic pattern ELP1, the second organic pattern ELP2, and the third organic pattern ELP3 may be directly disposed on the second bank layer BN2 of the bank structure BNS. The organic patterns ELP1, ELP2, and ELP3 may be formed in the same process as the process of forming the light emitting layers EL1, EL2, and EL3 including the same material as those of the organic patterns ELP1, ELP2, and ELP3, and may be disposed near (e.g., adjacent to) the emission areas EA1, EA2, and EA3 in which the light emitting layers EL1, EL2 and EL3 are disposed, respectively. For example, the first organic pattern ELP1 may be disposed on the second bank layer BN2, while surrounding (e.g., around a periphery of) the first opening OPE1 near (e.g., adjacent to) the first opening OPE1 or the first emission area EA1. The second organic pattern ELP2 may be disposed on the second bank layer BN2, while surrounding (e.g., around a periphery of) the second opening OPE2 near (e.g., adjacent to) the second opening OPE2 or the second emission area EA2. The third organic pattern ELP3 may be disposed on the second bank layer BN2, while surrounding (e.g., around a periphery of) the third opening OPE3 near (e.g., adjacent to) the third opening OPE3 or the third emission area EA3.

The organic patterns ELP1, ELP2, and ELP3 may be traces formed as they are disconnected without being connected with the light emitting layers EL1, EL2, and EL3 due to the tip TIP of the bank structure BNS. The light emitting layers EL1, EL2, and EL3 may be formed in the openings OPE1, OPE2, and OPE3, respectively, and the organic patterns ELP1, ELP2, and ELP3 and the light emitting layers EL1, EL2, and EL3 may be disconnected by the tip TIP formed on the sidewalls of the openings OPE1, OPE2, and OPE3. Because the light emitting layers EL1, EL2, and EL3 are formed by the deposition process using no mask, the materials of the light emitting layers EL1, EL2, and EL3 may be formed on the entire or substantially entire bank structure BNS. The organic patterns ELP1, ELP2, and ELP3 may be formed by patterning them near (e.g., adjacent to) the emission areas EA1, EA2, and EA3 or the openings OPE1, OPE2, and OPE3.

The common electrodes CE1, CE2, and CE3 may be disposed on the light emitting layers EL1, EL2, and EL3, respectively. The common electrodes CE1, CE2, and CE3 may include a transparent conductive material, so that the light generated in the light emitting layers EL1, EL2, and EL3 may be emitted. The common electrodes CE1, CE2, and CE3 may receive a common voltage or a low potential voltage. When the pixel electrodes AE1, AE2, and AE3 receive the voltage corresponding to a data voltage, and the common electrodes CE1, CE2, and CE3 receive the low potential voltage, a potential difference is formed between the pixel electrodes AE1, AE2, and AE3 and the common electrodes CE1, CE2, and CE3, so that the light emitting layers EL1, EL2, and EL3 may emit light.

The common electrodes CE1, CE2, and CE3 may include the first common electrode CE1, the second common electrode CE2, and the third common electrode CE3 disposed in the different emission areas EA1, EA2, and EA3. The first common electrode CE1 may be disposed on the first light emitting layer EL1 in the first emission area EA1, the second common electrode CE2 may be disposed on the second light emitting layer EL2 in the second emission area EA2, and the third common electrode CE3 may be disposed on the third light emitting layer EL3 in the third emission area EA3.

In accordance with an embodiment, the common electrodes CE1, CE2, and CE3 of the light emitting elements ED1, ED2, and ED3 may be partially disposed on the side surface of the first bank layer BN1 of the bank structure BNS. Similarly to the light emitting layers EL1, EL2, and EL3, the common electrodes CE1, CE2, and CE3 may also be formed by a deposition process. The deposition process of the common electrodes CE1, CE2, and CE3 may be performed, such that the electrode material is deposited in an inclined direction rather than a direction perpendicular to or substantially perpendicular to the top surface of the substrate SUB. Accordingly, the common electrodes CE1, CE2, and CE3 may be disposed on the side surface of the first bank layer BN1 under the tip TIP of the second bank layer BN2 of the bank structure BNS. The common electrodes CE1, CE2, and CE3 may be in direct contact with the side surface of the first bank layer BN1. The common electrodes CE1, CE2, and CE3 of the different light emitting elements ED1, ED2, and ED3 may be in direct contact with the first bank layer BN1 of the bank structure BNS, and the common electrodes CE1, CE2, and CE3 may be electrically connected to each other. Unlike the pixel electrodes AE1, AE2, and AE3, the common electrodes CE1, CE2, and CE3 may be implemented in the form of an electrode that is electrically common to all of the pixels without being divided for each of the plurality of pixels.

In accordance with an embodiment, the contact area between the common electrodes CE1, CE2, and CE3 and the side surface of the first bank layer BN1 may be greater than the contact area between the light emitting layers EL1, EL2, and EL3 and the side surface of the first bank layer BN1. The common electrodes CE1, CE2, and CE3 and the light emitting layers EL1, EL2, and EL3 are formed, such that the materials thereof are deposited in an inclined direction rather than in a direction perpendicular to or substantially perpendicular to the top surface of the substrate SUB, and the area disposed on the side surface of the first bank layer BN1 may vary depending on the inclined angle. In an embodiment, the deposition process of the common electrodes CE1, CE2, and CE3 may be performed in a more inclined direction than that of the deposition process of the light emitting layers EL1, EL2, and EL3. The common electrodes CE1, CE2, and CE3 may be disposed in larger areas on the sidewalls of the openings OPE1, OPE2, and OPE3 when compared to those of the light emitting layers EL1, EL2, and EL3, or may be located at higher positions on the sidewalls of the openings OPE1, OPE2, and OPE3 when compared to those of the light emitting layers EL1, EL2, and EL3. Because the common electrodes CE1, CE2, and CE3 of the different light emitting elements ED1, ED2, and ED3 are electrically connected to each other through the first bank layer BN1, the common electrodes CE1, CE2, and CE3 may be in contact with (e.g., in direct contact with) the first bank layer BN1 in larger areas.

The display device 10 according to an embodiment may include the plurality of electrode patterns CEP1, CPE2, and CEP3 including the same material as those of the common electrodes CE1, CE2, and CE3, and disposed on the bank structure BNS. Because the common electrodes CE1, CE2, and CE3 are formed by a process of depositing a material on the entire or substantially entire surface of the display device 10, the materials forming the common electrodes CE1, CE2, and CE3 may also be deposited on the bank structure BNS in addition to the openings OPE1, OPE2, and OPE3 of the bank structure BNS.

The display device 10 may include the electrode patterns CEP1, CPE2, and CEP3 disposed above the bank structure BNS. The electrode patterns CEP1, CPE2, and CEP3 may include the first electrode pattern CEP1, the second electrode pattern CEP2, and the third electrode pattern CEP3 disposed on the second bank layer BN2 of the bank structure BNS.

For example, the first electrode pattern CEP1, the second electrode pattern CEP2, and the third electrode pattern CEP3 may be directly disposed on the first organic pattern ELP1, the second organic pattern ELP2, and the third organic pattern ELP3, respectively. The arrangement relationship of the electrode patterns CEP1, CEP2, and CEP3 and the organic patterns ELP1, ELP2, and ELP3 may be the same or substantially the same as the arrangement relationship of the light emitting layers EL1, EL2, and EL3 of the light emitting elements ED1, ED2, and ED3 and the common electrodes CE1, CE2, and CE3. The electrode patterns CEP1, CPE2, and CEP3 may be traces formed because the deposited material is disconnected without being connected with the common electrodes CE1, CE2, and CE3 due to the tip TIP of the bank structure BNS. In the display device 10, the common electrodes CE1, CE2, and CE3 may be individually formed in different areas from each other even in a deposition process using no mask due to the tip TIP of the bank structure BNS.

A capping layer CPL may be disposed on the common electrodes CE1, CE2, and CE3. The capping layer CPL may include an inorganic insulating material to cover the patterns disposed on the bank structure BNS and the light emitting elements ED1, ED2, and ED3. The capping layer CPL may prevent or substantially prevent the light emitting elements ED1, ED2, and ED3 from being damaged by external air, and may prevent or substantially prevent the patterns disposed on the bank structure BNS from being peeled off during the manufacturing process of the display device 10. In an embodiment, the capping layer CPL may include aluminum oxide, titanium oxide, tantalum oxide, hafnium oxide, zinc oxide, silicon oxide, silicon nitride, and/or silicon oxynitride.

The display device 10 may include a capping pattern CLP disposed on the bank structure BNS. The capping pattern CLP may be directly disposed on the first electrode pattern CEP1, the second electrode pattern CEP2, and the third electrode pattern CEP3 disposed on the second bank layer BN2 of the bank structure BNS. The disposition relationship of the capping pattern CLP and the electrode patterns CEP1, CEP2, and CEP3 may be the same or substantially the same as the disposition relationship of the common electrodes CE1, CE2, and CE3 of the light emitting elements ED1, ED2, and ED3 and the capping layer CPL. The capping pattern CLP may be a trace formed because the deposited material is disconnected without being connected with the capping layer CPL due to the tip TIP of the bank structure BNS.

The plurality of organic patterns ELP1, ELP2, and ELP3, the electrode patterns CEP1, CPE2, and CEP3, and the capping pattern CLP may be disposed on the bank structure BNS, and may be disposed to surround (e.g., to surround around) the peripheries of the emission areas EA1, EA2, and EA3 or the openings OPE1, OPE2, and OPE3, respectively. The stacked structure of the organic patterns ELP1, ELP2, and ELP3, the electrode patterns CEP1, CPE2, and CEP3, and the capping pattern CLP disposed around the emission areas EA1, EA2, and EA3 may be partially etched in the manufacturing process of the display device 10, so that the pattern shape may be changed. Accordingly, a part of the top surface of the second bank layer BN2 of the bank structure BNS may not be covered by the organic patterns ELP1, ELP2, and ELP3, the electrode patterns CEP1, CPE2, and CEP3, and the capping pattern CLP.

The thin film encapsulation layer TFEL may be disposed on the light emitting elements ED1, ED2, and ED3 and the bank structure BNS, and may cover the plurality of light emitting elements ED1, ED2, and ED3 and the bank structure BNS. The thin film encapsulation layer TFEL may include at least one inorganic layer to prevent or substantially prevent oxygen and/or moisture from permeating into the light emitting element layer EML. The thin film encapsulation layer TFEL may include at least one organic layer to protect the light emitting element layer EML from foreign substances, such as dust.

In an embodiment, the thin film encapsulation layer TFEL may include the first encapsulation layer TFE1, a second encapsulation layer TFE2, and a third encapsulation layer TFE3 that are sequentially stacked. The first encapsulation layer TFE1 and the third encapsulation layer TFE3 may be inorganic encapsulation layers, and the second encapsulation layer TFE2 disposed between the first encapsulation layer TFE1 and the third encapsulation layer TFE3 may be an organic encapsulation layer.

Each of the first encapsulation layer TFE1 and the third encapsulation layer TFE3 may include one or more inorganic insulating materials. The inorganic insulating material may include aluminum oxide, titanium oxide, tantalum oxide, hafnium oxide, zinc oxide, silicon oxide, silicon nitride, and/or silicon oxynitride.

The second encapsulation layer TFE2 may include a polymer-based material. Examples of the polymer-based material may include an acrylic resin, an epoxy resin, polyimide, polyethylene, and the like. For example, the second encapsulation layer TFE2 may include an acrylic resin, for example, such as polymethyl methacrylate, polyacrylic acid, or the like. The second encapsulation layer TFE2 may be formed by curing a monomer or applying a polymer.

The first encapsulation layer TFE1 may be disposed on the light emitting elements ED1, ED2, and ED3, the plurality of patterns, and the bank structure BNS. The first encapsulation layer TFE1 may include the first inorganic layer TL1, the second inorganic layer TL2, and the third inorganic layer TL3 disposed to correspond to the different emission areas EA1, EA2, and EA3, respectively.

The first inorganic layer TL1, the second inorganic layer TL2, and the third inorganic layer TL3 may include an inorganic insulating material to cover the light emitting elements ED1, ED2, and ED3, respectively. The first inorganic layer TL1, the second inorganic layer TL2, and the third inorganic layer TL3 may prevent or substantially prevent the light emitting elements ED1, ED2, and ED3 from being damaged by external air, and may prevent or substantially prevent the patterns disposed on the bank structure BNS from being peeled off during the manufacturing process of the display device 10. In an embodiment, the first inorganic layer TL1, the second inorganic layer TL2, and the third inorganic layer TL3 may include aluminum oxide, titanium oxide, tantalum oxide, hafnium oxide, zinc oxide, silicon oxide, silicon nitride, and/or silicon oxynitride.

The first inorganic layer TL1, the second inorganic layer TL2, and the third inorganic layer TL3 may be disposed to cover the organic patterns ELP1, ELP2, and ELP3, the electrode patterns CEP1, CPE2, and CEP3, and the capping pattern CLP. Because the first inorganic layer TL1, the second inorganic layer TL2, and the third inorganic layer TL3 may be formed by a chemical vapor deposition (CVD) method, they may be formed to have a uniform or substantially uniform thickness along stepped portions of the deposited layers. For example, the first inorganic layer TL1, the second inorganic layer TL2, and the third inorganic layer TL3 may form thin films even under the undercut by the tip TIP of the bank structure BNS.

The first inorganic layer TL1 may be disposed on the first light emitting element ED1 and the first electrode pattern CEP1. The first inorganic layer TL1 may be disposed to cover the first light emitting element ED1 and the first opening OPE1 along the inner sidewalls thereof, and may also be disposed to cover the first organic pattern ELP1, the first electrode pattern CEP1, and the capping pattern CLP. However, the first inorganic layer TL1 may not overlap with the second opening OPE2 and the third opening OPE3, and may be disposed on (e.g., only on) the first opening OPE1 and the bank structure BNS in the periphery of the first opening OPE1.

The second inorganic layer TL2 may be disposed on the second light emitting element ED2 and the second electrode pattern CEP2. The second inorganic layer TL2 may be disposed to cover the second light emitting element ED2 and the second opening OPE2 along the inner sidewalls thereof, and may also be disposed to cover the second organic pattern ELP2, the second electrode pattern CEP2, and the capping pattern CLP. However, the second inorganic layer TL2 may not overlap with the first opening OPE1 and the third opening OPE3, and may be disposed on (e.g., only on) the second opening OPE2 and the bank structure BNS in the periphery of the second opening OPE2.

The third inorganic layer TL3 may be disposed on the third light emitting element ED3 and the third electrode pattern CEP3. The third inorganic layer TL3 may be disposed along the inner sidewalls of the third light emitting element ED3 and the third opening OPE3 to cover them, and may also be disposed to cover the third organic pattern ELP3, the third electrode pattern CEP3, and the capping pattern CLP. However, the third inorganic layer TL3 may not overlap with the first opening OPE1 and the second opening OPE2, and may be disposed on (e.g., only on) the third opening OPE3 and the bank structure BNS in the periphery of the third opening OPE3.

The first inorganic layer TL1 may be formed after the first common electrode CE1 is formed. The second inorganic layer TL2 may be formed after the second common electrode CE2 is formed. The third inorganic layer TL3 may be formed after the third common electrode CE3 is formed. Accordingly, the first to third inorganic layers TL1, TL2, and TL3 may be disposed to cover the different electrode patterns CEP1, CPE2, and CEP3 and the organic patterns ELP1, ELP2, and ELP3, respectively. In a plan view, the first inorganic layer TL1, the second inorganic layer TL2, and the third inorganic layer TL3 may have larger areas than those of the openings OPE1, OPE2, and OPE3 of the bank structure BNS, respectively. The first inorganic layer TL1, the second inorganic layer TL2, and the third inorganic layer TL3 may be spaced apart from each other on the bank structure BNS. Accordingly, a part of the second bank layer BN2 of the bank structure BNS may not overlap with the inorganic layers TL1, TL2, and TL3, and a part of the top surface of the second bank layer BN2 may be exposed without being covered by the inorganic layers TL1, TL2, and TL3. A part of the second bank layer BN2 may be in direct contact with the second encapsulation layer TFE2 of the thin film encapsulation layer TFEL, which will be described in more detail below.

The touch sensing layer TSU may be disposed on the encapsulation layer TFEL. The touch sensing layer TSU may include a first touch insulating layer SIL1, a second touch insulating layer SIL2, a touch electrode TEL, and a third touch insulating layer SIL3.

The first touch insulating layer SIL1 may be disposed on the encapsulation layer TFEL. The first touch insulating layer SIL1 may have an insulating and optical function. The first touch insulating layer SIL1 may include at least one inorganic layer. However, the first touch insulating layer SIL1 may be omitted as needed or desired.

The second touch insulating layer SIL2 may cover the first touch insulating layer SIL1. A touch electrode of another layer may be further disposed on the first touch insulating layer SIL1, and the second touch insulating layer SIL2 may cover the touch electrode. The second touch insulating layer SIL2 may have an insulating and optical function. For example, the second touch insulating layer SIL2 may be an inorganic layer including (e.g., containing) at least one of a silicon nitride layer, a silicon oxynitride layer, a silicon oxide layer, a titanium oxide layer, or an aluminum oxide layer.

A part of the touch electrode TEL may be disposed on the second touch insulating layer SIL2. The touch electrode TEL may not overlap with the first to third emission areas EA1, EA2, and EA3. The touch electrode TEL may be formed of a single layer including (e.g., containing) molybdenum (Mo), titanium (Ti), copper (Cu), aluminum (Al), or indium tin oxide (ITO), or may be formed to have a stacked structure of aluminum and titanium (e.g., Ti/Al/Ti), a stacked structure of aluminum and ITO (e.g., ITO/Al/ITO), an Ag—Pd—Cu (APC) alloy, or a stacked structure of an APC alloy and ITO (e.g., ITO/APC/ITO).

The third touch insulating layer SIL3 may cover the touch electrode TEL and the second touch insulating layer SIL2. The third touch insulating layer SIL3 may have an insulating and optical function. The third touch insulating layer SIL3 may include (e.g., may be made of) any one or more of the materials described above in association with the second touch insulating layer SIL2.

The light blocking layer BM may be disposed on the touch sensing layer TSU. The light blocking layer BM may include the plurality of opening holes OPT1, OPT2, and OPT3 disposed to overlap with the emission areas EA1, EA2, and EA3. For example, the first opening hole OPT1 may be disposed to overlap with the first emission area EA1. The second opening hole OPT2 may be disposed to overlap with the second emission area EA2, and the third opening hole OPT3 may be disposed to overlap with the third emission area EA3. The areas or sizes of the opening holes OPT1, OPT2, and OPT3 may be larger than the areas or sizes of the emission areas EA1, EA2, and EA3 defined by the bank structure BNS, respectively. The opening holes OPT1, OPT2, and OPT3 of the light blocking layer BM are formed to be larger than the emission areas EA1, EA2, and EA3, so that the light emitted from the emission areas EA1, EA2, and EA3 may be visually recognized by the user from the front surface as well as from the side surface of the display device 10.

The light blocking layer BM may include a light absorbing material. For example, the light blocking layer BM may include an inorganic black pigment or an organic black pigment. The inorganic black pigment may be carbon black, and the organic black pigment may include at least one of lactam black, perylene black, or aniline black, but the present disclosure is not limited thereto. The light blocking layer BM may prevent or substantially prevent visible light infiltration and color mixture between the first to third emission areas EA1, EA2, and EA3, and thus, may lead to the improvement of color reproducibility of the display device 10.

The display device 10 may include the plurality of color filters CF1, CF2, and CF3 disposed on the emission areas EA1, EA2, and EA3. The plurality of color filters CF1, CF2, and CF3 may be disposed to correspond to the emission areas EA1, EA2, and EA3, respectively. For example, the color filters CF1, CF2, and CF3 may be disposed on the light blocking layer BM including the plurality of opening holes OPT1, OPT2, and OPT3 disposed to correspond to the emission areas EA1, EA2, and EA3, respectively. The holes of the light blocking layer may be formed to overlap with the emission areas EA1, EA2, and EA3, or the openings of the bank structures BNS, and may form a light exit area from which the light emitted from the emission areas EA1, EA2, and EA3 is emitted. The color filters CF1, CF2, and CF3 may have areas larger than those of the holes of the light blocking layer BM, and the color filters CF1, CF2, and CF3 may completely cover the light exit area formed by the holes.

The color filters CF1, CF2, and CF3 may include the first color filter CF1, the second color filter CF2, and the third color filter CF3 disposed to correspond to the different emission areas EA1, EA2, and EA3, respectively. The color filters CF1, CF2, and CF3 may include a colorant, such as a dye or a pigment, that absorbs light in a wavelength band other than a specific wavelength band, and may be disposed to correspond to the color of the light emitted from the emission areas EA1, EA2, and EA3. For example, the first color filter CF1 may be a red color filter that is disposed to overlap with the first emission area EA1, and transmits only the first light of the red color. The second color filter CF2 may be a green color filter that is disposed to overlap with the second emission area EA2, and transmits only the second light of the green color. The third color filter CF3 may be a blue color filter that is disposed to overlap with the third emission area EA3, and transmits only the third light of the blue color.

The plurality of color filters CF1, CF2, and CF3 may be spaced apart from other adjacent color filters CF1, CF2, and CF3 on the light blocking layer BM. The color filters CF1, CF2, and CF3 may have areas larger than those of the opening holes OPT1, OPT2, and OPT3 of the light blocking layer BM, respectively, while covering the holes, and may have areas small enough to be spaced apart from the other color filters CF1, CF2, and CF3 on the light blocking layer BM. However, the present disclosure is not limited thereto. The plurality of color filters CF1, CF2, and CF3 may be disposed to partially overlap with other adjacent color filters CF1, CF2, and CF3. The different color filters CF1, CF2, and CF3 are areas that do not overlap with the emission areas EA1, EA2, and EA3, and may overlap with each other on the light blocking layer BM. In the display device 10, the color filters CF1, CF2, and CF3 are disposed to overlap with each other, so that the intensity of the reflected light by external light may be reduced. Furthermore, the color of the reflected light by the external light may be controlled by adjusting the disposition, shape, and area of the color filters CF1, CF2, and CF3 in a plan view.

The color filters CF1, CF2, and CF3 of the color filter layer CFL may be disposed on the light blocking layer BM.

The different color filters CF1, CF2, and CF3 may be disposed to correspond to the different emission areas EA1, EA2, and EA3 or the openings OPE1, OPE2, and OPE3 and the opening holes OPT1, OPT2, and OPT3 of the light blocking layer BM, respectively. For example, the first color filter CF1 may be disposed to correspond to the first emission area EA1, the second color filter CF2 may be disposed to correspond to the second emission area EA2, and the third color filter CF3 may be disposed to correspond to the third emission area EA3. The first color filter CF1 may be disposed in the first opening hole OPT1 of the light blocking layer BM, the second color filter CF2 may be disposed in the second opening hole OPT2 of the light blocking layer BM, and the third color filter CF3 may be disposed in the third opening hole OPT3 of the light blocking layer BM. Each of the color filters CF1, CF2, and CF3 may be disposed to have a larger area in a plan view than those of the opening holes OPT1, OPT2, and OPT3 of the light blocking layer BM, and some may be disposed directly on the light blocking layer BM.

An overcoat layer OC may be disposed on the color filters CF1, CF2, and CF3 to planarize or substantially planarize the top ends of the color filters CF1, CF2, and CF3. The overcoat layer OC may be a colorless light transmissive layer that does not have a color in a visible light band. For example, the overcoat layer OC may include a colorless light transmissive organic material, such as an acrylic resin.

Figure 8:
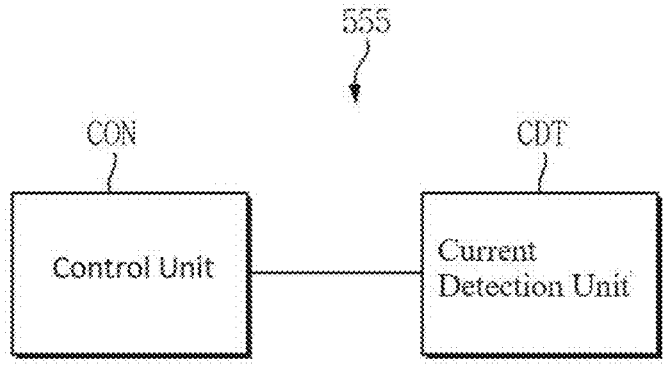
FIG. 8 is a block diagram of a current detection device of a display device according to an embodiment.

FIG. 8 is a block diagram of a current detection device 555 of a display device according to an embodiment.

Referring to FIG. 8, the current detection device 555 according to an embodiment may include a control unit (e.g., a controller) CON and a current detection unit (e.g., a current detector or a current detection circuit) CDT.

The current detection device 555 may be disposed in the non-display area NDA of the display device described above. For example, the control unit CON and the current detection unit CDT may be disposed on the non-display area NDA of the substrate SUB.

Figure 9:
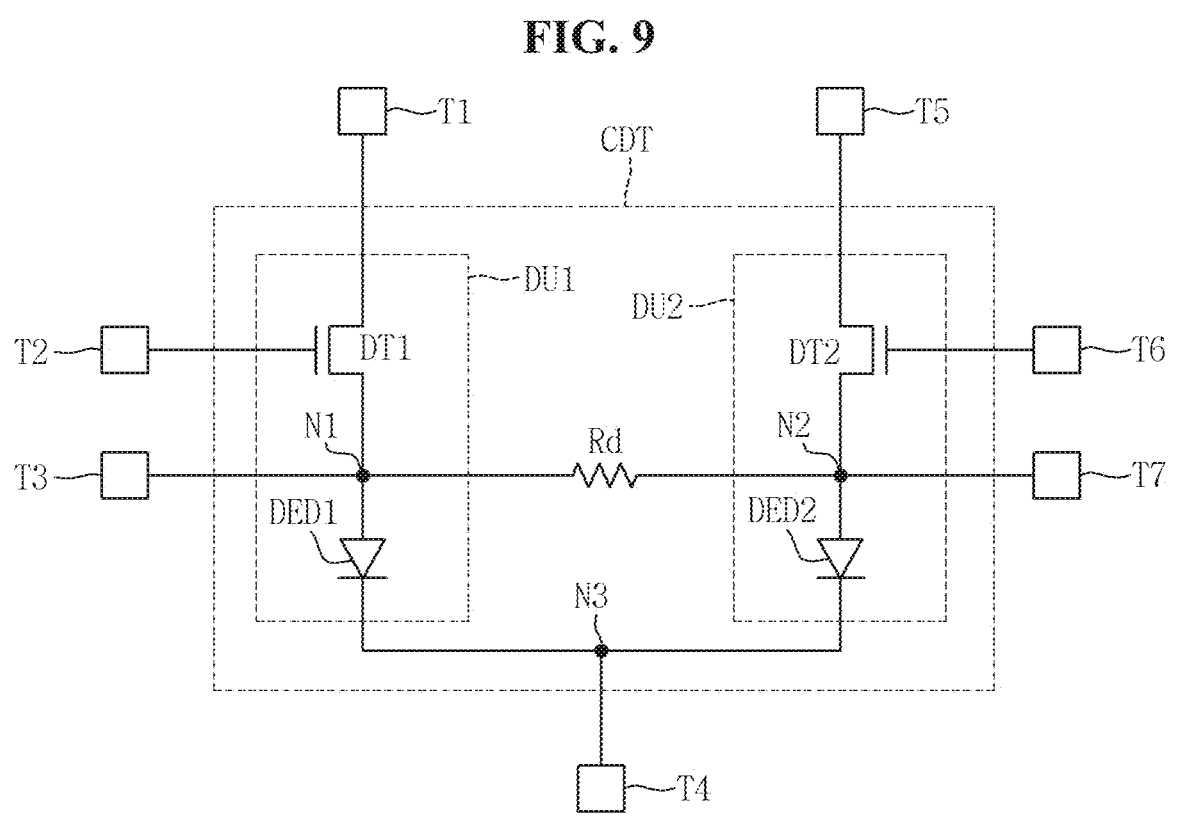

FIG. 9 is a detailed block diagram of the current detection unit CDT according to an embodiment. For example, the current detection unit CDT of FIG. 9 may be one example of the current detection unit CDT described above with reference to FIG. 8.

The current detection unit CDT may include a first driver DU1 and a second driver DU2, as shown in FIG. 9.

The first driver DU1 may include a first dummy transistor DT1 and a first dummy light emitting element DED1.

The first dummy transistor DT1 may be connected between a first terminal T1 and a first anode electrode of the first dummy light emitting element DED1. For example, the first dummy transistor DT1 may be connected between the first terminal T1 and a first node N1. According to an embodiment, the first dummy transistor DT1 may include a first gate electrode connected to a second terminal T2, a first drain electrode connected to the first terminal T1, and a first source electrode connected to the first node N1. The first dummy transistor DT1 may be, for example, the same as the thin film transistor TFT of the display area DA described above. According to an embodiment, the first dummy transistor DT1 and the thin film transistor TFT may be formed concurrently (e.g., simultaneously or substantially simultaneously) with each other through the same or substantially the same process.

The first dummy light emitting element DED1 may be connected between the first source electrode of the first dummy transistor DT1 and a fourth terminal T4. For example, the first dummy light emitting element DED1 may be connected between the first node N1 and a third node N3. According to an embodiment, the first dummy light emitting element DED1 may include the first anode electrode connected to the first node N1, and a first cathode electrode connected to the fourth terminal T4 via the third node N3. The first dummy light emitting element DED1 may be the same as any one of the light emitting elements ED1, ED2, and ED3 of the display area DA described above. For example, the first dummy light emitting element DED1 may be the same as a red light emitting element disposed in the display area DA, and may provide red light. In other words, the first dummy light emitting element DED1 may be a red light emitting element that provides red light. The first dummy light emitting element DED1 and the red light emitting element of the display area may be formed concurrently (e.g., simultaneously or substantially simultaneously) with each other through the same or substantially the same process. According to an embodiment, the first dummy light emitting element DED1 may include a first light emitting layer between the first anode electrode and the first cathode electrode, and the first light emitting layer of the first dummy light emitting element DED1 may be the same as the first light emitting layer of the display area DA described above. For example, the first light emitting layer of the first dummy light emitting element DED1 may include a hole transporting layer, an organic light emitting layer, and an electron transporting layer, and the organic light emitting layer of the first dummy light emitting element DED1 may provide red light. The first anode electrode of the first dummy light emitting element DED1 may correspond to the pixel electrode described above, and the first cathode electrode of the first dummy light emitting element DED1 may correspond to the common electrode described above.

The first node N1 may be connected to a third terminal T3.

The second driver DU2 may include a second dummy transistor DT2 and a second dummy light emitting element DED2.

The second dummy transistor DT2 may be connected between a fifth terminal T5 and a second anode electrode of the second dummy light emitting element DED2. For example, the second dummy transistor DT2 may be connected between the fifth terminal T5 and a second node N2. According to an embodiment, the second dummy transistor DT2 may include a second gate electrode connected to a sixth terminal T6, a second drain electrode connected to the fifth terminal T5, and a second source electrode connected to the second node N2. The second dummy transistor DT2 may be, for example, the same as the thin film transistor TFT of the display area DA described above. According to an embodiment, the first dummy transistor DT1, the second dummy transistor DT2, and the thin film transistor TFT may be formed concurrently (e.g., simultaneously or substantially simultaneously) with each other through the same or substantially the same process.

The second dummy light emitting element DED2 may be connected between the second source electrode of the second dummy transistor DT2 and the fourth terminal T4. For example, the second dummy light emitting element DED2 may be connected between the second node N2 and the third node N3. According to an embodiment, the second dummy light emitting element DED2 may include the second anode electrode connected to the second node N2, and a second cathode electrode connected to the fourth terminal T4 via the third node N3. The second dummy light emitting element DED2 may be the same as any one of the light emitting elements ED1, ED2, and ED3 of the display area DA described above. However, the second dummy light emitting element DED2 may be different from the first dummy light emitting element DED1 described above. In other words, the second dummy light emitting element DED2 and the first dummy light emitting element DED1 may provide light of different colors from each other. For example, the second dummy light emitting element DED2 may be the same as a green light emitting element disposed in the display area DA, and may provide green light. In other words, the second dummy light emitting element DED2 may be a green light emitting element that provides green light. The second dummy light emitting element DED2 and the green light emitting element of the display area DA may be formed concurrently (e.g., simultaneously or substantially simultaneously) with each other through the same or substantially the same process. According to an embodiment, the second dummy light emitting element DED2 may include a second light emitting layer between the second anode electrode and the second cathode electrode, and the second light emitting layer of the second dummy light emitting element DED2 may be the same as the second light emitting layer of the display area DA described above. For example, the second light emitting layer of the second dummy light emitting element DED2 may include a hole transporting layer, an organic light emitting layer, and an electron transporting layer, and the organic light emitting layer of the second dummy light emitting element DED2 may provide green light. The second anode electrode of the second dummy light emitting element DED2 may correspond to the pixel electrode described above, and the second cathode electrode of the second dummy light emitting element DED2 may correspond to the common electrode described above.

The second node N2 may be connected to a seventh terminal T7.

The first cathode electrode of the first dummy light emitting element DED1 and the second cathode electrode of the second dummy light emitting element DED2 may be connected in common to the third node N3, and the third node N3 may be connected to the fourth terminal T4.

According to an embodiment, the first light emitting layer of the first dummy light emitting element DED1 may provide light other than the red light described above. For example, the first light emitting layer of the first dummy light emitting element DED1 may be a light emitting layer that provides green light or blue light. In addition, the second light emitting layer of the second dummy light emitting element DED2 may provide light other than the green light described above. For example, the second light emitting layer of the second dummy light emitting element DED2 may be a light emitting layer that provides red light or blue light. However, as described above, assuming that the first light emitting layer of the first dummy light emitting element DED1 and the second light emitting layer of the second dummy light emitting element DED2 provide light of different colors from each other, the first dummy light emitting element DED1 and the second dummy light emitting element DED2 described above may provide light of various colors.

A resistor Rd may be connected between the first anode electrode of the first dummy light emitting element DED1 and the second anode electrode of the second dummy light emitting element DED2. The resistor Rd may represent a resistance value of the light emitting layer disconnected by the bank structure BNS described above. For example, the first light emitting layer of the first dummy light emitting element DED1 and the second light emitting layer of the second dummy light emitting element DED2 adjacent thereto may be separated from each other in a bank structure region (e.g., a region in which the bank structure BNS is disposed) by the bank structure BNS, and the aforementioned resistor Rd may refer to a resistance value of the first light emitting layer and a resistance value of the second light emitting layer that are separated in the bank structure region by the bank structure BNS. In other words, the first light emitting layer of the first dummy light emitting element DED1 and the second light emitting layer of the second dummy light emitting element DED2 adjacent thereto may be partially connected to each other in a portion other than the aforementioned bank structure region, and the aforementioned resistor Rd may refer to a resistance of a structure including the connected portion and the disconnected portion of the first light emitting layer of the first dummy light emitting element DED1 and the second light emitting layer of the second dummy light emitting element DED2.

The first driver DU1 and the second driver DU2 may be connected to each other through the aforementioned resistor Rd. For example, the first driver DU1 and the second driver DU2 may be connected in parallel to each other through the aforementioned resistor Rd.

Figure 10:
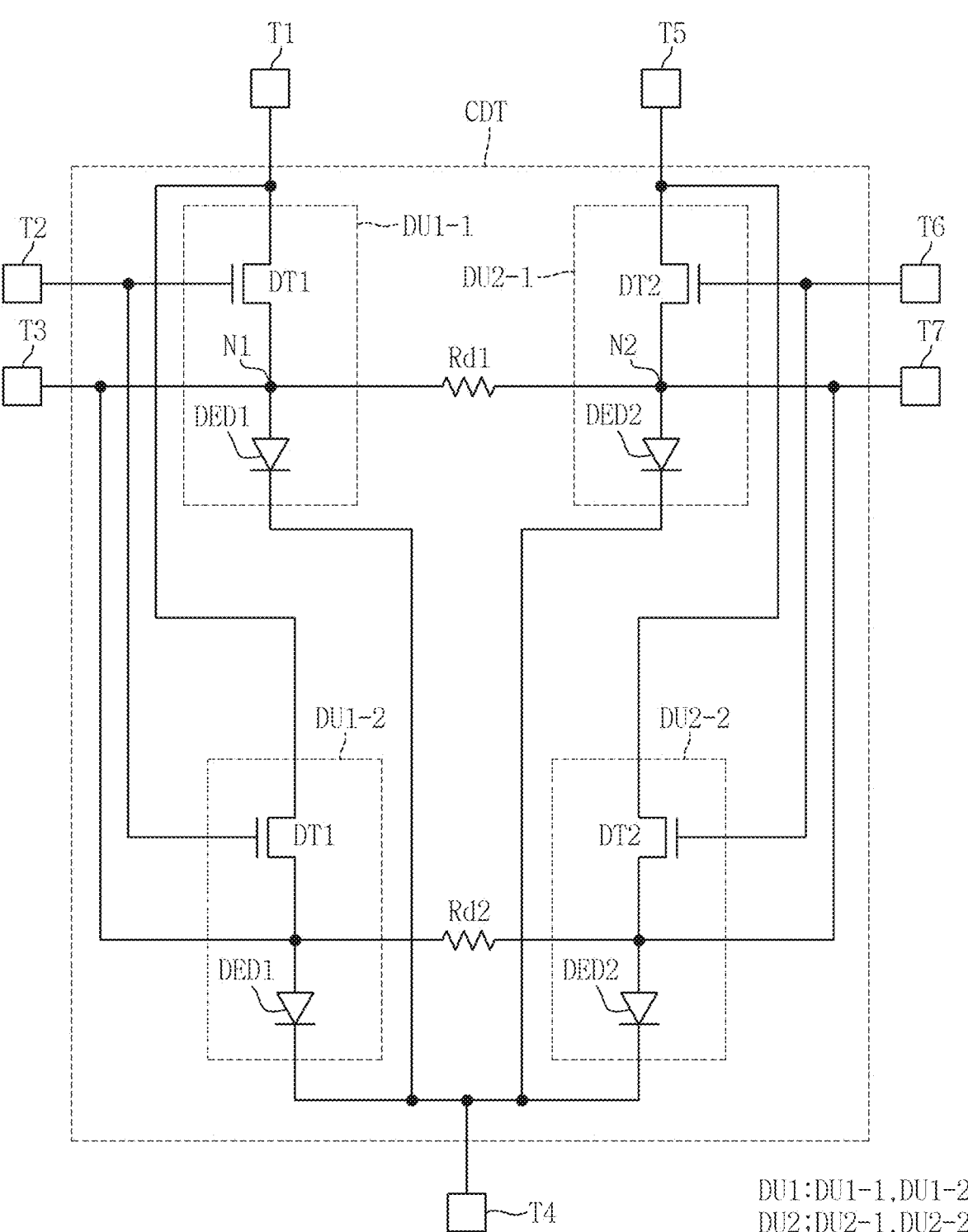
FIG. 10 is a detailed block diagram of the current detection unit according to an embodiment.

FIG. 10 is a detailed block diagram of the current detection unit CDT according to an embodiment. For example, the current detection unit CDT of FIG. 10 may be an embodiment of the current detection unit CDT described above with reference to FIG. 8.

As shown in FIG. 10, the current detection unit CDT may include a first-first driver DU1-1, a first-second driver DU1-2, a second-first driver DU2-1, and a second-second driver DU2-2. In other words, the current detection unit CDT may include a plurality of first drivers DU1 and a plurality of second drivers DU2. The plurality of first drivers DU1 (e.g., the first-first driver DU1-1 and the first-second driver DU1-2) may be connected in common to the first terminal T1, the second terminal T2, the third terminal T3, and the fourth terminal T4. The plurality of second drivers DU2 (e.g., the second-first driver DU2-1 and the second-second driver DU2-2) may be connected in common to the fifth terminal T5, the sixth terminal T6, the seventh terminal T7, and the fourth terminal T4.

The first-first driver DU1-1 and the first-second driver DU1-2 may each be the same as the first driver DU1 described above with reference to FIG. 9.

The first dummy transistor DT1 of the first-first driver DU1-1 and the first dummy transistor DT1 of the first-second driver DU1-2 may be connected to the second terminal T2 through their respective first gate electrodes, may be connected to the first terminal T1 through their respective first drain electrodes, and may be connected to the first node N1 and the third terminal T3 through their respective first source electrodes.

The first dummy light emitting element DED1 of the first-first driver DU1-1 and the first dummy light emitting element DED1 of the first-second driver DU1-2 may be connected to the first node N1 and the third terminal T3 through their respective first anode electrodes, and may be connected to the fourth terminal T4 through their respective first cathode electrodes.

The second-first driver DU2-1 and the second-second driver DU2-2 may each be the same as the second driver DU2 described above with reference to FIG. 9.

The second dummy transistor DT2 of the second-first driver DU2-1 and the second dummy transistor DT2 of the second-second driver DU2-2 may be connected to the sixth terminal T6 through their respective second gate electrodes, may be connected to the fifth terminal T5 through their respective second drain electrodes, and may be connected to the second node N2 and the seventh terminal T7 through their respective second source electrodes.

The second dummy light emitting element DED2 of the second-first driver DU2-1 and the second dummy light emitting element DED2 of the second-second driver DU2-2 may be connected to the second node N2 and the seventh terminal T7 through their respective second anode electrodes, and may be connected to the fourth terminal T4 through their respective second cathode electrodes.

The plurality of first dummy light emitting elements DED1 of the plurality of first drivers DU1 (e.g., the first-first driver DU1-1 and the first-second driver DU1-2) may all provide light of the same color as each other. For example, the first dummy light emitting element DED1 of the first-first driver DU1-1 and the first dummy light emitting element DED1 of the first-second driver DU1-2 may each provide red light.

The plurality of second dummy light emitting elements DED2 of the plurality of second drivers DU2 (e.g., the second-first driver DU2-1 and the second-second driver DU2-2) may all provide light of the same color as each other. However, as described above, the second dummy light emitting element DED2 and the first dummy light emitting element DED1 may provide light of different colors from each other. For example, the second dummy light emitting element DED2 of the second-first driver DU2-1 and the second dummy light emitting element DED2 of the second-second driver DU2-2 may each provide green light.

A first resistor Rd1 may be connected between the first anode electrode of the first dummy light emitting element DED1 provided in the first-first driver DU1-1 and the second anode electrode of the second dummy light emitting element DED2 provided in the second-first driver DU2-1. The first resistor Rd1 may be a resistor representing a resistance value of the light emitting layer disconnected by the bank structure BNS described above. For example, the first light emitting layer of the first dummy light emitting element DED1 provided in the first-first driver DU1-1 and the second light emitting layer of the second dummy light emitting element DED2 provided in the second-first driver DU2-1 adjacent thereto may be separated in the bank structure region (e.g., the region in which the bank structure BNS is disposed) by the bank structure BNS, and the aforementioned first resistor Rd1 may refer to a resistance value of the first light emitting layer provided in the first-first driver DU1-1 and a resistance value of the second light emitting layer provided in the second-first driver DU2-1 separated in the bank structure region by the bank structure BNS. In other words, the first light emitting layer of the first dummy light emitting element DED1 and the second light emitting layer of the second dummy light emitting element DED2 adjacent thereto may be partially connected in a portion other than the aforementioned bank structure region, and the aforementioned first resistor Rd1 may refer to a resistance of a structure including the connected portion and the disconnected portion of the first light emitting layer of the first dummy light emitting element DED1 and the second light emitting layer of the second dummy light emitting element DED2.

A second resistor Rd2 may be connected between the first anode electrode of the first dummy light emitting element DED1 provided in the first-second driver DU1-2 and the second anode electrode of the second dummy light emitting element DED2 provided in the second-second driver DU2-2. The second resistor Rd2 may be a resistor representing a resistance value of the light emitting layer disconnected by the bank structure BNS described above. For example, the first light emitting layer of the first dummy light emitting element DED1 provided in the first-second driver DU1-2 and the second light emitting layer of the second dummy light emitting element DED2 provided in the second-second driver DU2-2 adjacent thereto may be separated in the bank structure region (e.g., the region in which the bank structure BNS is disposed) by the bank structure BNS, and the aforementioned second resistor Rd2 may refer to a resistance value of the first light emitting layer provided in the first-second driver DU1-2 and a resistance value of the second light emitting layer provided in the second-second driver DU2-2 separated in the bank structure region by the bank structure BNS. In other words, the first light emitting layer of the first dummy light emitting element DED1 and the second light emitting layer of the second dummy light emitting element DED2 adjacent thereto may be partially connected in a portion other than the aforementioned bank structure region, and the aforementioned second resistor Rd2 may refer to a resistance of a structure including the connected portion and the disconnected portion of the first light emitting layer of the first dummy light emitting element DED1 and the second light emitting layer of the second dummy light emitting element DED2.

The first drivers DU1 (e.g., the first-first driver DU1-1 and the first-second driver DU1-2) and the second drivers DU2 (e.g., the second-first driver DU2-1 and the second-second driver DU2-2) may be connected to each other through the aforementioned resistors (e.g., the first resistor Rd1 and the second resistor Rd2). For example, the first drivers DU1 (e.g., the first-first driver DU1-1 and the first-second driver DU1-2) and the second drivers DU2 (e.g., the second-first driver DU2-1 and the second-second driver DU2-2) may be connected in parallel to each other through the aforementioned resistors (e.g., the first resistor Rd1 and the second resistor Rd2).

According to an embodiment, the current detection unit CDT may include three or more first drivers DU1 and three or more second drivers DU2.

Figure 11:
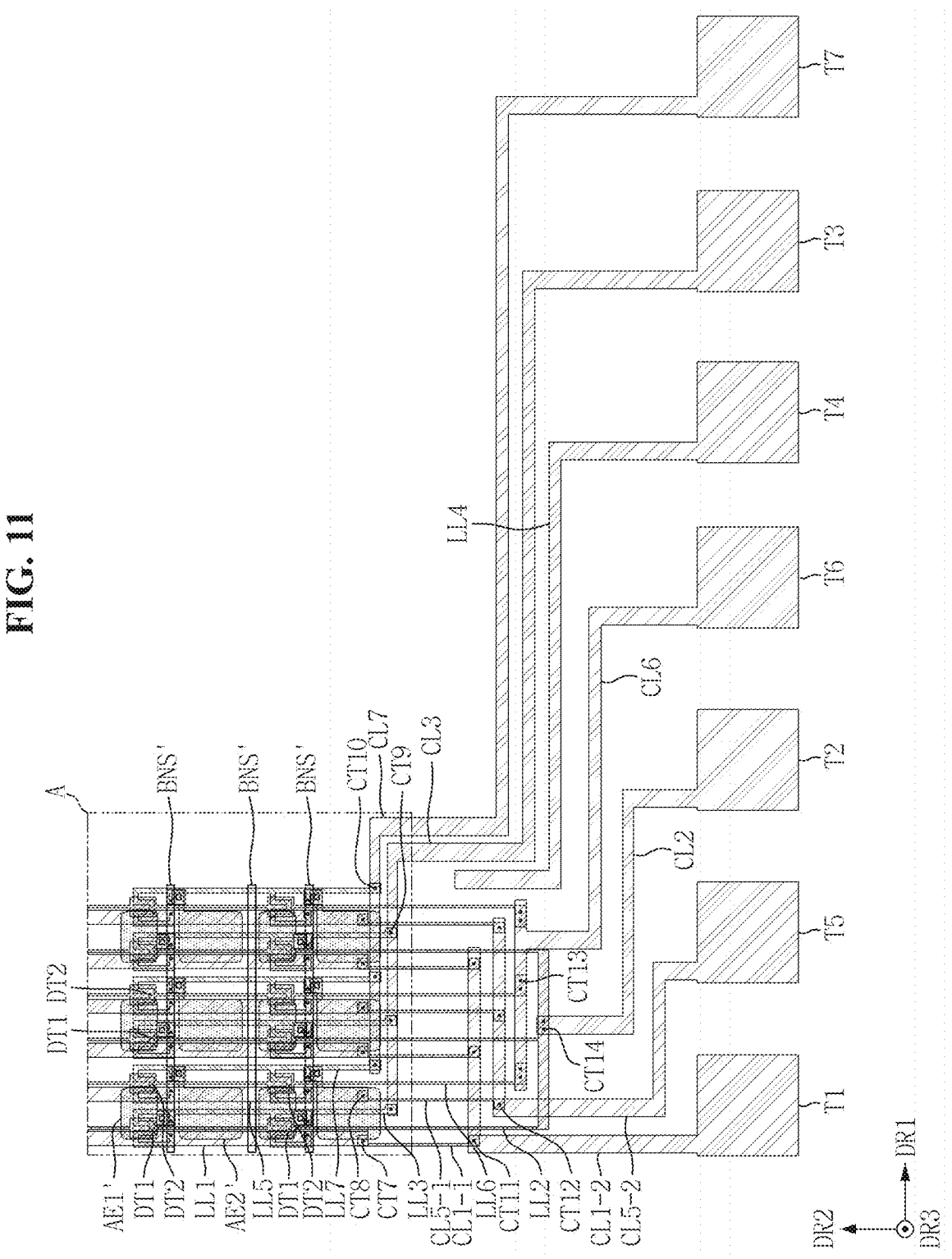
FIG. 11 is an array diagram of the current detection unit of the display device according to an embodiment.
Figure 12:
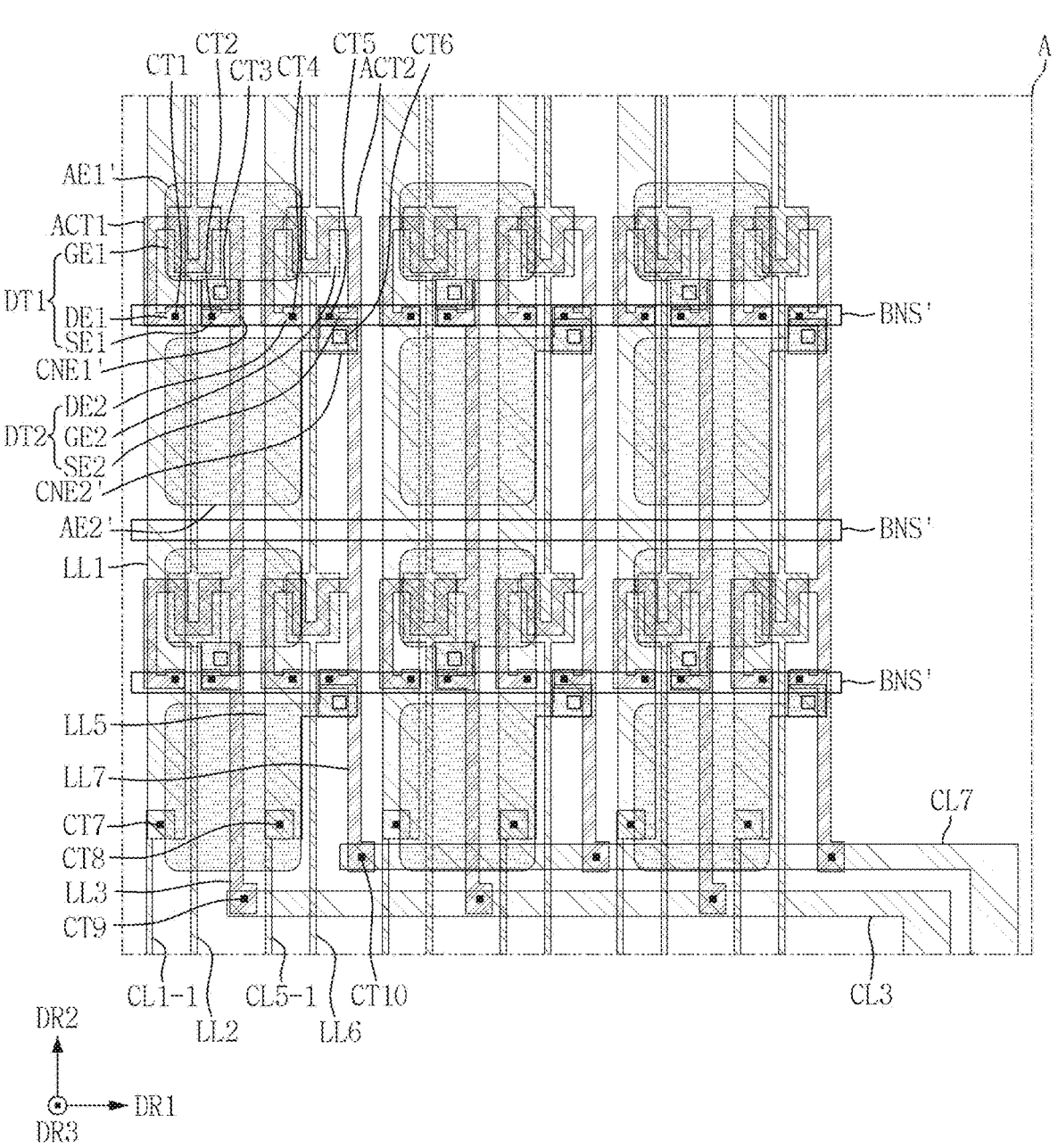
FIG. 12 is an enlarged view of the part A of FIG. 11.
Figure 13:
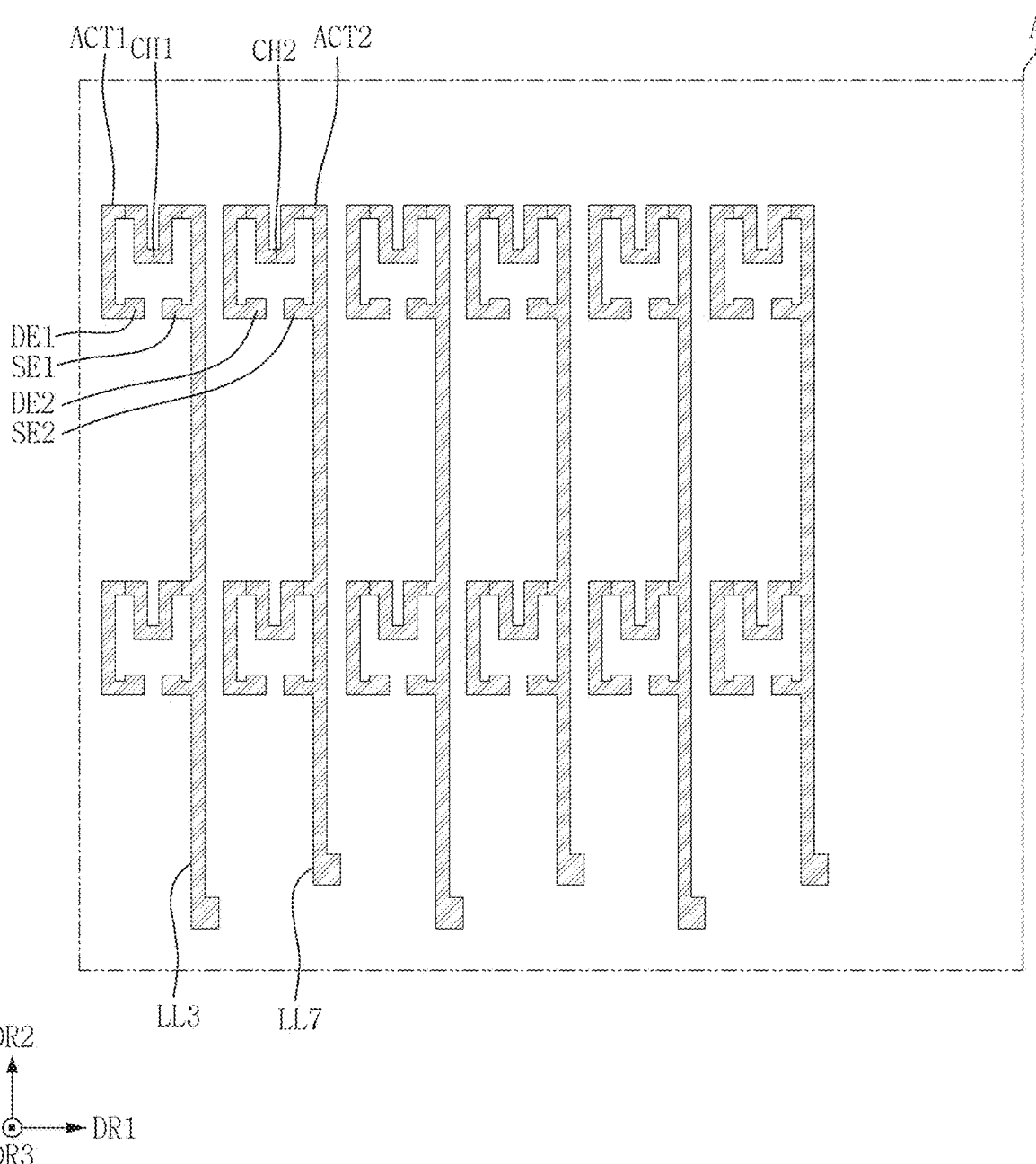
FIG. 13 is a view showing a first pattern layer of FIG. 12.
Figure 14:
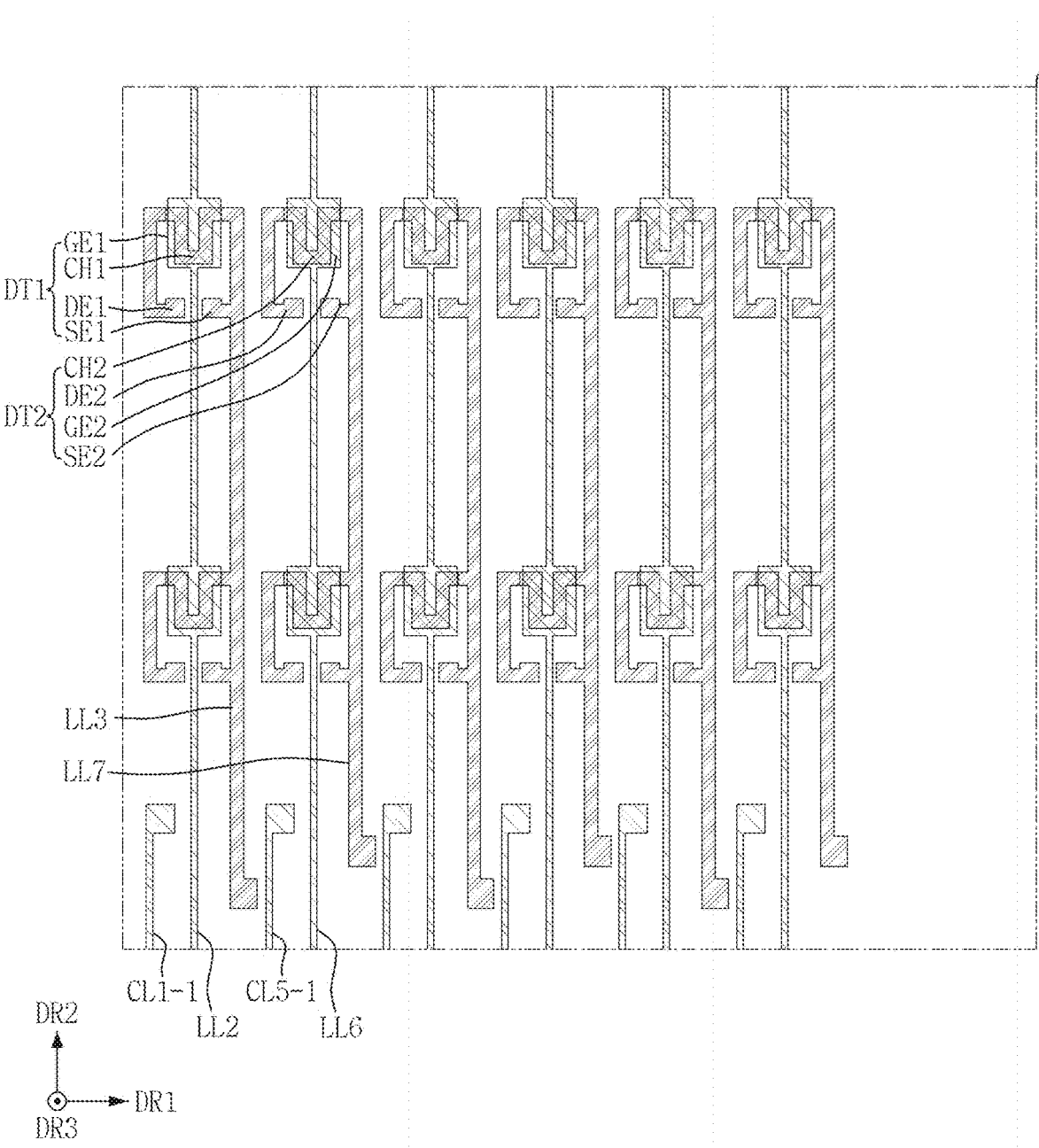
FIG. 14 is a view showing a first pattern layer and a second pattern layer of FIG. 12.
Figure 15:
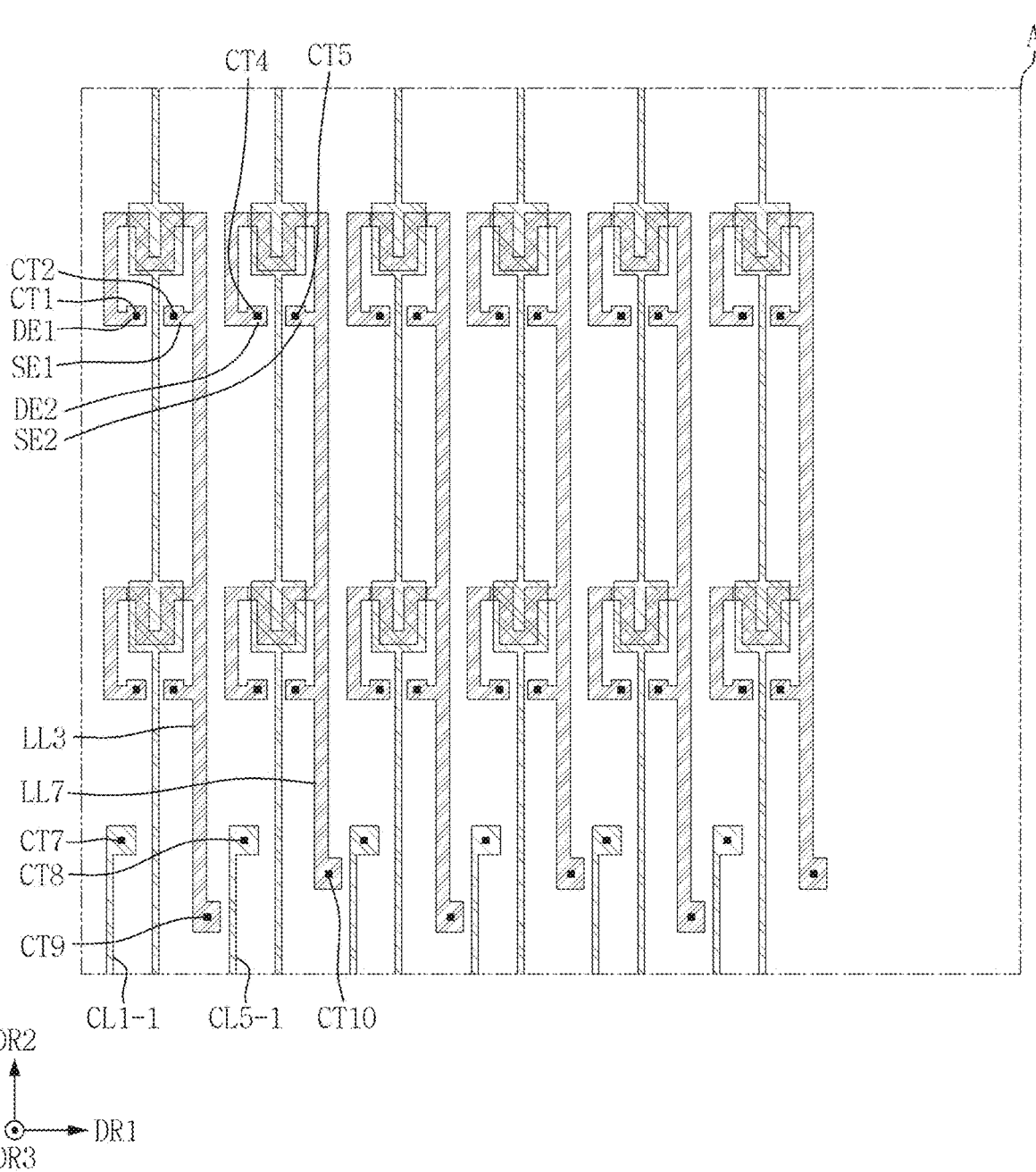
FIG. 15 is a view showing a first pattern layer, a second pattern layer, and a first type contact hole of FIG. 12.
Figure 16:
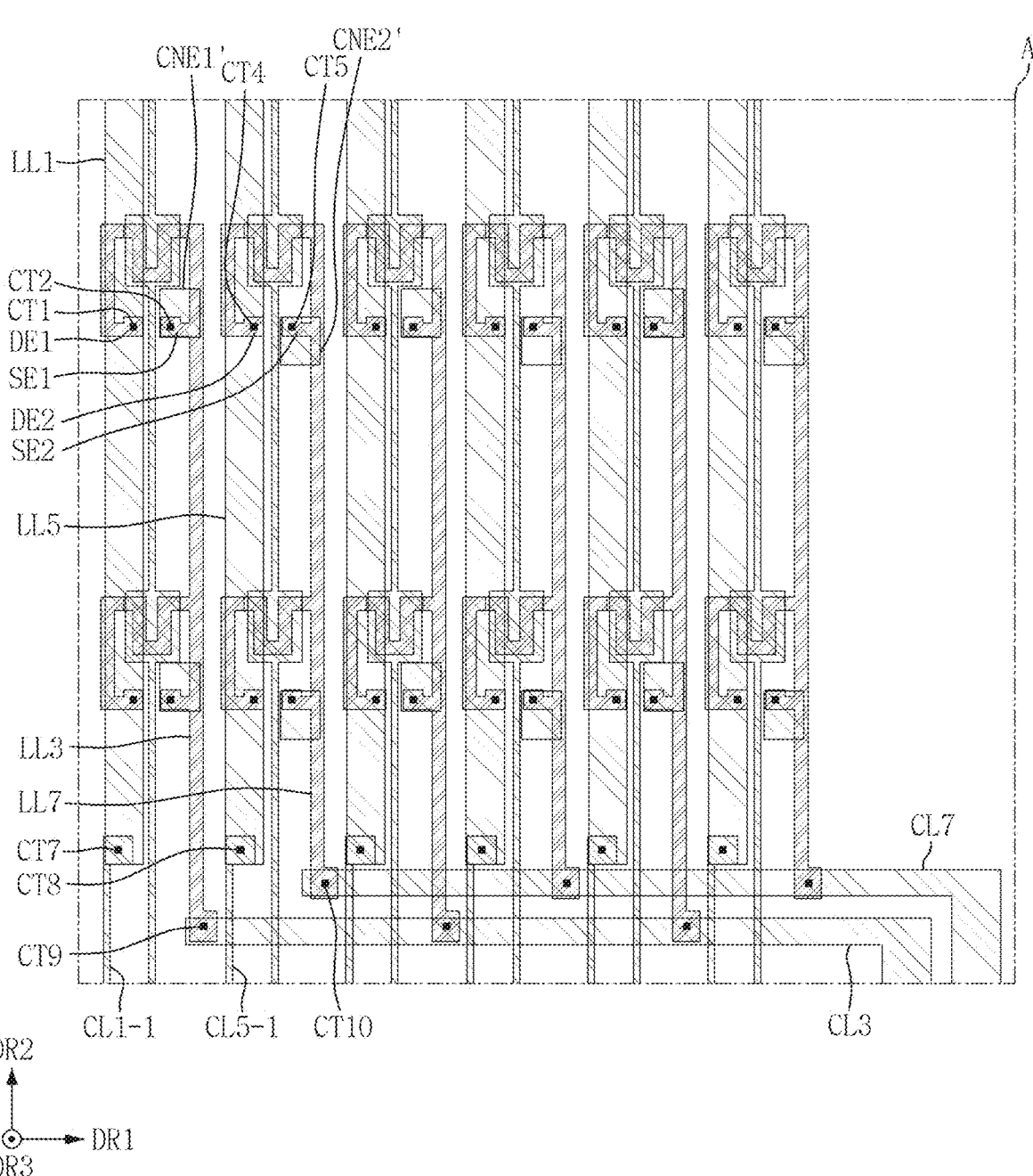
FIG. 16 is a view showing a first pattern layer, a second pattern layer, a third pattern layer, and a first type contact hole of FIG. 12.
Figure 17:
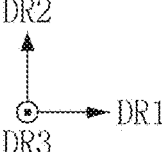
FIG. 17 is a view showing a first pattern layer, a second pattern layer, a third pattern layer, a first type contact hole, and a second type contact hole of FIG. 12.
Figure 18:
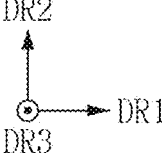
FIG. 18 is a view showing a first pattern layer, a second pattern layer, a third pattern layer, a fourth pattern layer, a first type contact hole, and a second type contact hole of FIG. 12.
Figure 19:
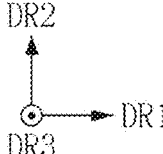
FIG. 19 is a view showing a first pattern layer, a second pattern layer, a third pattern layer, a fourth pattern layer, a first type contact hole, a second type contact hole, and emission areas of FIG. 12.

FIG. 11 is an array diagram of the current detection unit CDT of the display device according to an embodiment. For example, FIG. 11 may be an array diagram of the current detection unit CDT including six first drivers DU1 and six second drivers DU2. FIG. 12 is an enlarged view of the part A of FIG. 11. FIG. 13 is a view showing a first pattern layer of FIG. 12. FIG. 14 is a view showing a first pattern layer and a second pattern layer of FIG. 12. FIG. 15 is a view showing a first pattern layer, a second pattern layer, and a first type contact hole of FIG. 12. FIG. 16 is a view showing a first pattern layer, a second pattern layer, a third pattern layer, and a first type contact hole of FIG. 12. FIG. 17 is a view showing a first pattern layer, a second pattern layer, a third pattern layer, a first type contact hole, and a second type contact hole of FIG. 12. FIG. 18 is a view showing a first pattern layer, a second pattern layer, a third pattern layer, a fourth pattern layer, a first type contact hole, and a second type contact hole of FIG. 12. FIG. 19 is a view showing a first pattern layer, a second pattern layer, a third pattern layer, a fourth pattern layer, a first type contact hole, a second type contact hole, and emission areas of FIG. 12.

The first pattern layer may be disposed on the second buffer layer BF2 described above. As shown in FIGS. 11 to 13, the first pattern layer may include at least one first active layer ACT1 and at least one second active layer ACT2. The first active layer ACT1 and the second active layer ACT2 may be disposed alternately. For example, the first active layer ACT1 and the second active layer ACT2 may be disposed alternately along the first direction DR1. For example, along the first direction DR1, an odd-numbered active layer may be the first active layer ACT1 and an even-numbered active layer may be the second active layer ACT2.

The first active layer ACT1 may include a first channel region CH1, a first drain electrode DE1, a first source electrode SE1, and a third transmission line LL3.

The second active layer ACT2 may include a second channel region CH2, a second drain electrode DE2, a second source electrode SE2, and a seventh transmission line LL7.

The first pattern layer may include the same material as that of the above-described active layer ACT.

The first pattern layer may be formed at (e.g., in or on) the same layer as that of the above-described active layer ACT. The first pattern layer and the active layer ACT may be formed through the same or substantially the same process.

The second pattern layer may be disposed on the first pattern layer in the third direction DR3. For example, the second pattern layer may be disposed on the gate insulating layer GI described above. As shown in FIGS. 11, 12, and 14, the second pattern layer may include a first gate electrode GE1, a second transmission line LL2, a second gate electrode GE2, a sixth transmission line LL6, a first-first connection line CL1-1, and a fifth-first connection line CL5-1.

The first gate electrode GE1 may overlap with the first active layer ACT1. A region of the first active layer ACT1 overlapping with the first gate electrode GE1 may be the first channel region CH1 of the first dummy transistor DT1. For example, the first dummy transistor DT1 may include the first gate electrode GE1, the first source electrode SE1, the first drain electrode DE1, and the first channel region CH1. The plurality of first gate electrodes GE1 disposed along the second direction DR2 may be connected to each other by the second transmission line LL2. For example, the plurality of first gate electrodes GE1 and the second transmission line LL2 may be formed integrally with each other.

The second gate electrode GE2 may overlap with the second active layer ACT2. A region of the second active layer ACT2 overlapping with the second gate electrode GE2 may be the second channel region CH2 of the second dummy transistor DT2. For example, the second dummy transistor DT2 may include the second gate electrode GE2, the second source electrode SE2, the second drain electrode DE2, and the second channel region CH2. The plurality of second gate electrodes GE2 disposed along the second direction DR2 may be connected to each other by the sixth transmission line LL6. For example, the plurality of second gate electrodes GE2 and the sixth transmission line LL6 may be formed integrally with each other.

The first-first connection line CL1-1 may be disposed adjacent to the second transmission line LL2.

The fifth-first connection line CL5-1 may be disposed adjacent to the sixth transmission line LL6.

The second pattern layer may include (e.g., may contain) the same material as that of the gate electrode GE described above.

The second pattern layer may be formed at (e.g., in or on) the same layer as that of the gate electrode GE described above. The second pattern layer and the gate electrode GE may be formed through the same or substantially the same process.

As shown in FIGS. 11, 12, and 15, the first type contact hole may include a first contact hole CT1, a second contact hole CT2, a fourth contact hole CT4, a fifth contact hole CT5, a seventh contact hole CT7, an eighth contact hole CT8, a ninth contact hole CT9, a tenth contact hole CT10, an eleventh contact hole CT11, a twelfth contact hole CT12, a thirteenth contact hole CT13, and a fourteenth contact hole CT14.

The first contact hole CT1 may penetrate the second interlayer insulating layer ILD2, the first interlayer insulating layer ILD1, and the gate insulating layer GI. The first drain electrode DE1 may be exposed through the first contact hole CT1.

The second contact hole CT2 may penetrate the second interlayer insulating layer ILD2, the first interlayer insulating layer ILD1, and the gate insulating layer GI. The first source electrode SE1 may be exposed through the second contact hole CT2.

The fourth contact hole CT4 may penetrate the second interlayer insulating layer ILD2, the first interlayer insulating layer ILD1, and the gate insulating layer GI. The second drain electrode DE2 may be exposed through the fourth contact hole CT4.

The fifth contact hole CT5 may penetrate the second interlayer insulating layer ILD2, the first interlayer insulating layer ILD1, and the gate insulating layer GI. The second source electrode SE2 may be exposed through the fifth contact hole CT5.

The seventh contact hole CT7 may penetrate the second interlayer insulating layer ILD2 and the first interlayer insulating layer ILD1. The first-first connection line CL1-1 may be exposed through the seventh contact hole CT7.

The eighth contact hole CT8 may penetrate the second interlayer insulating layer ILD2 and the first interlayer insulating layer ILD1. The fifth-first connection line CL5-1 may be exposed through the eighth contact hole CT8.

The ninth contact hole CT9 may penetrate the second interlayer insulating layer ILD2, the first interlayer insulating layer ILD1, and the gate insulating layer GI. The third transmission line LL3 may be exposed through the ninth contact hole CT9.

The tenth contact hole CT10 may penetrate the second interlayer insulating layer ILD2, the first interlayer insulating layer ILD1, and the gate insulating layer GI. The seventh transmission line LL7 may be exposed through the tenth contact hole CT10.

The eleventh contact hole CT11 may penetrate the second interlayer insulating layer ILD2 and the first interlayer insulating layer ILD1. The first-first connection line CL1-1 may be exposed through the eleventh contact hole CT11.

The twelfth contact hole CT12 may penetrate the second interlayer insulating layer ILD2 and the first interlayer insulating layer ILD1. The fifth-first connection line CL5-1 may be exposed through the twelfth contact hole CT12.

The thirteenth contact hole CT13 may penetrate the second interlayer insulating layer ILD2 and the first interlayer insulating layer ILD1. The sixth transmission line LL6 may be exposed through the thirteenth contact hole CT13.

The fourteenth contact hole CT14 may penetrate the second interlayer insulating layer ILD2 and the first interlayer insulating layer ILD1. The second transmission line LL2 may be exposed through the fourteenth contact hole CT14.

The third pattern layer may be disposed on the second pattern layer in the third direction DR3. For example, the third pattern layer may be disposed on the second interlayer insulating layer ILD2 described above. As shown in FIGS. 11, 12, and 16, the third pattern layer may include a first transmission line LL1, a fifth transmission line LL5, a first connection electrode CNE1', a second connection electrode CNE2', a third connection line CL3, a seventh connection line CL7, a first-second connection line CL1-2, a fifth-second connection line CL5-2, a sixth connection line CL6, a fourth transmission line LL4, a second connection line CL2, the first terminal T1, the second terminal T2, the third terminal T3, the fourth terminal T4, the fifth terminal T5, the sixth terminal T6, and the seventh terminal T7.

The first transmission line LL1 may be connected to the first drain electrode DE1 through the first contact hole CT1. In addition, the first transmission line LL1 may be connected to the first-first connection line CL1-1 through the seventh contact hole CT7.

The fifth transmission line LL5 may be connected to the second drain electrode DE2 through the fourth contact hole CT4. In addition, the fifth transmission line LL5 may be connected to the fifth-first connection line CL5-1 through the eighth contact hole CT8.

The first connection electrode CNE1' may be connected to the first source electrode SE1 through the second contact hole CT2.

The second connection electrode CNE2' may be connected to the second source electrode SE2 through the fifth contact hole CT5.

The third connection line CL3 may be connected to the third transmission lines LL3 through the ninth contact holes CT9. The third connection line CL3 may be connected to the third terminal T3. The third connection line CL3 and the third terminal T3 may be formed integrally with each other. For example, the third connection line CL3 may include the third terminal T3 at one end thereof.

The seventh connection line CL7 may be connected to the seventh transmission lines LL7 through the tenth contact holes CT10. The seventh connection line CL7 may be connected to the seventh terminal T7. The seventh connection line CL7 and the seventh terminal T7 may be formed integrally with each other. For example, the seventh connection line CL7 may include the seventh terminal T7 at one end thereof.

The first-second connection line CL1-2 may be connected to the first-first connection lines CL1-1 through the eleventh contact holes CT11. The first-second connection line CL1-2 may be connected to the first terminal T1. The first-second connection line CL1-2 and the first terminal T1 may be formed integrally with each other. For example, the first-second connection line CL1-2 may include the first terminal T1 at one end thereof.

The fifth-second connection line CL5-2 may be connected to the fifth-first connection lines CL5-1 through the twelfth contact holes CT12. The fifth-second connection line CL5-2 may be connected to the fifth terminal T5. The fifth-second connection line CL5-2 and the fifth terminal T5 may be formed integrally with each other. For example, the fifth-second connection line CL5-2 may include the fifth terminal T5 at one end thereof.

The sixth connection line CL6 may be connected to the sixth transmission lines LL6 through the thirteenth contact holes CT13. The sixth connection line CL6 may be connected to the sixth terminal T6. The sixth connection line CL6 and the sixth terminal T6 may be formed integrally with each other. For example, the sixth connection line CL6 may include the sixth terminal T6 at one end thereof.

In some embodiments, the fourth transmission line LL4 may be connected to the first cathode electrodes of the first dummy light emitting elements DED1 and the second cathode electrodes of the second dummy light emitting elements DED2. The first cathode electrodes and the second cathode electrodes may be formed integrally with each other. In other words, the first cathode electrodes and the second cathode electrodes formed integrally with each other may be the common electrodes. The fourth transmission line LL4 may be connected to the fourth terminal T4. The fourth transmission line LL4 and the fourth terminal T4 may be formed integrally with each other. For example, the fourth transmission line LL4 may include the fourth terminal T4 at one end thereof.

The second connection line CL2 may be connected to the second transmission lines LL2 through the fourteenth contact holes CT14. According to an embodiment, one ends of the second transmission lines LL2 may be connected to each other. One ends of the second transmission lines LL2 may be connected to the second connection line CL2. The second connection line CL2 may be connected to the second terminal T2. The second connection line CL2 and the second terminal T2 may be formed integrally with each other. For example, the second connection line CL2 may include the second terminal T2 at one end thereof.

The third pattern layer may include the same material as that of the above-described first connection electrode CNE1.

The third pattern layer may be formed at (e.g., in or on) the same layer as that of the above-described first connection electrode CNE1. The third pattern layer and the first connection electrode CNE1 may be formed through the same or substantially the same process.

As shown in FIGS. 11, 12, and 17, the second type contact hole may include a third contact hole CT3 and a sixth contact hole CT6.

The third contact hole CT3 may penetrate the second passivation layer PAS2 and the first passivation layer PAS1. The first connection electrode CNE1' may be exposed through the third contact hole CT3.

The sixth contact hole CT6 may penetrate the second passivation layer PAS2 and the first passivation layer PAS1. The second connection electrode CNE2' may be exposed through the sixth contact hole CT6.

The fourth pattern layer may be disposed on the third pattern layer in the third direction DR3. For example, the fourth pattern layer may be disposed on the second passivation layer PAS2 described above. As shown in FIGS. 11, 12, and 18, the fourth pattern layer may include a first anode electrode AE1' and a second anode electrode AE2'.

The first anode electrode AE1' may be connected to the first connection electrode CNE1' through the third contact hole CT3.

The second anode electrode AE2' may be connected to the second connection electrode CNE2' through the sixth contact hole CT6.

The fourth pattern layer may include the same material as that of the above-described first pixel electrode AE1.

The fourth pattern layer may be formed at (e.g., in or on) the same layer as that of the above-described first pixel electrode AE1. The fourth pattern layer and the first pixel electrode AE1 may be formed through the same or substantially the same process.

According to an embodiment, a first auxiliary connection electrode may be further disposed between the first connection electrode CNE1' and the first anode electrode AE1'. The first auxiliary connection electrode may be disposed on the first passivation layer PAS1, similarly to the second connection electrode CNE2 described above. One side of the first auxiliary connection electrode may be connected to the first connection electrode CNE1' through a contact hole penetrating the first passivation layer PAS1, and the other side of the first auxiliary connection electrode may be connected to the first anode electrode AE1' through a contact hole penetrating the second passivation layer PAS2.

According to an embodiment, a second auxiliary connection electrode may be further disposed between the second connection electrode CNE2' and the second anode electrode AE2'. The second auxiliary connection electrode may be disposed on the first passivation layer PAS1, similarly to the second connection electrode CNE2 described above. One side of the second auxiliary connection electrode may be connected to the second connection electrode CNE2' through a contact hole penetrating the first passivation layer PAS1, and the other side of the second auxiliary connection electrode may be connected to the second anode electrode AE2' through a contact hole penetrating the second passivation layer PAS2.

As shown in FIG. 19, a bank structure BNS' may be disposed on the first anode electrode AE1' and the second anode electrode AE2'. The bank structure BNS' may be disposed between the dummy light emitting elements that provide light of different colors from each other. For example, the bank structure BNS' may be disposed between the first anode electrode AE1' of the first dummy light emitting element DED1 and the second anode electrode AE2' of the second dummy light emitting element DED2. The bank structure BNS' may form a bar shape extending along the first direction DR1. The plurality of bank structures BNS' may be arranged along the second direction DR2.

The bank structure BNS' may include the first bank layer BN1 and the second bank layer BN2.

The bank structure BNS' may include (e.g., may contain) the same material as that of the bank structure BNS described above.

The bank structure BNS' may be formed at (e.g., in or on) the same layer as that of the bank structure BNS described above.

According to an embodiment, the thin film encapsulation layer TFEL and the light blocking layer BM described above may be disposed on the bank structure BNS'. In this case, on the current detection device 555, the light blocking layer BM does not have the opening holes OPT1, OPT2, and OPT3. For example, the light blocking layer BM may be disposed on the current detection device 555, such that it covers all of the patterns of the current detection device 555 shown in FIG. 11. In other words, the light blocking layer BM may be disposed on the dummy transistors and the dummy light emitting elements of the current detection device 555, such that it covers all of the dummy transistors and dummy light emitting elements.

According to an embodiment, the second connection electrode CNE2 of FIG. 6 may be omitted as needed or desired. In such a case, the first pixel electrode AE1 may be directly connected to the first connection electrode CNE1 through a contact hole penetrating the second passivation layer PAS2 and the first passivation layer PAS1. Similarly, the second pixel electrode AE2 and the third pixel electrode AE3 may also be directly connected to the first connection electrode CNE1 through contact holes penetrating the second passivation layer PAS2 and the first passivation layer PAS1, without the second connection electrode CNE2.

The current detection device 555 according to an embodiment may indirectly measure a lateral leakage current between adjacent pixels of different colors. For example, the current detection device 555 as shown in FIG. 9 may measure the lateral leakage current flowing from the first driver DU1 to the second driver DU2 through the resistor Rd when the first dummy transistor DT1 is turned on and the second dummy transistor DT2 is turned off. In an example, the current detection device 555 may apply, through the control unit CON, an active level first dummy gate voltage to the second terminal T2, a first driving voltage to the first terminal T1, a common voltage to the fourth terminal T4, and a non-active level second dummy gate voltage to the sixth terminal T6, thereby operating the first dummy transistor DT1 in a turn-on state and the second dummy transistor DT2 in a turn-off state. In this case, a driving current flowing through the turned-on first dummy transistor DT1 may be applied to the first dummy light emitting element DED1. Accordingly, the first dummy light emitting element DED1 may emit light. If a lateral leakage current occurs between adjacent pixels that provide different colors from each other, a lateral leakage current may also occur between the first driver DU1 and the second driver DU2 that are adjacent to each other. For example, when a lateral leakage current occurs between adjacent pixels, the driving current applied to the first dummy light emitting element DED1 may be applied to the second dummy light emitting element DED2 through the resistor Rd. Therefore, the second dummy light emitting element DED2 may emit light by the lateral leakage current. In this case, the control unit CON of the current detection device 555 may quantitatively measure the value of the lateral leakage current by receiving (e.g., by sensing) the voltage of the second node N2 through the seventh terminal T7. Even though each of the first dummy light emitting element DED1 and the second dummy light emitting element DED2 emits light, as described above, the current detection device 555 including the first dummy light emitting element DED1 and the second dummy light emitting element DED2 may be disposed in the non-display area NDA and may be shielded by the light blocking layer BM, so that light from the first dummy light emitting element DED1 and the second dummy light emitting element DED2 may not be emitted to the outside of the display panel 100.

In another embodiment, the current detection device 555 may apply, through the control unit CON, an active level first dummy gate voltage to the second terminal T2, a first driving voltage to the first terminal T1, a common voltage to the fourth terminal T4, and an active level second dummy gate voltage to the sixth terminal T6, thereby operating each of the first dummy transistor DT1 and the second dummy transistor DT2 in a turn-on state. In this case, a driving current flowing through the turned-on first dummy transistor DT1 may be applied to the first dummy light emitting element DED1. In this case, the control unit CON of the current detection device 555 may quantitatively measure the value of the lateral leakage current by receiving (e.g., by sensing) the voltage of the second node N2 through the turned-on second dummy transistor DT2 and the fifth terminal T5. The lateral leakage current based on the voltage of the second node N2 may correspond to, for example, the lateral leakage current between adjacent pixels of different colors.

In another embodiment, the current detection device 555 may apply a second driving voltage to the second terminal T2 through the control unit CON. The aforementioned first driving voltage may be a driving voltage for driving the red light emitting element, and the second driving voltage may be a driving voltage for driving the green light emitting element. The first driving voltage and the second driving voltage may have different magnitudes from each other.

The first dummy gate voltage may have an active level or a non-active level as described above, and the active level may refer to a voltage greater than that of the threshold voltage of the first dummy transistor DT1, and the non-active level may refer to a voltage smaller than that of the threshold voltage of the first dummy transistor DT1. For example, as shown in FIG. 9, when the first dummy transistor DT1 is an N-type transistor, the active level of the first dummy gate voltage may be a voltage of positive polarity, and the non-active level of the first dummy gate voltage may be a voltage of negative polarity.

As described above, the second dummy gate voltage may have an active level or a non-active level. The active level may refer to a voltage greater than that of the threshold voltage of the second dummy transistor DT2, and the non-active level may refer to a voltage smaller than that of the threshold voltage of the second dummy transistor DT2. For example, as shown in FIG. 9, when the second dummy transistor DT2 is an N-type transistor, the active level of the second dummy gate voltage may be a voltage of positive polarity, and the non-active level of the second dummy gate voltage may be a voltage of negative polarity.

The electronic or electric devices and/or any other relevant devices or components according to embodiments of the present disclosure described herein (e.g., the control unit and the like) may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the example embodiments of the present disclosure.

The foregoing is illustrative of some embodiments of the present disclosure, and is not to be construed as limiting thereof. Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display device comprising:
a display panel comprising a display area and a non-display area;
a plurality of light emitting elements in the display area; and
a current detection device in the non-display area,
wherein:
the current detection device comprises a controller, and a current detection circuit configured to be controlled by the controller;
the current detection circuit comprises a first driver and a second driver;
the first driver comprises a first dummy light emitting element corresponding to a first light emitting element configured to provide light of a first color among the plurality of light emitting elements, the first dummy light emitting element located in the non-display area and configured to be driven to provide the light of the first color; and
the second driver comprises a second dummy light emitting element corresponding to a second light emitting element configured to provide light of a second color among the plurality of light emitting elements, the second dummy light emitting element located in the non-display area and configured to be driven to provide the light of the second color.

2. The display device of claim 1, wherein the first driver further comprises a first dummy transistor connected between a first terminal and the first dummy light emitting element.

3. The display device of claim 1, wherein the light of the first color is red light, and the light of the second color is green light.

4. The display device of claim 1, wherein the first driver and the second driver are connected in parallel with each other.

5. The display device of claim 1, further comprising a light blocking layer on the current detection device in the non-display area and overlapping with at least one of the first dummy light emitting element or the second dummy light emitting element in the non-display area to shield the light provided by the at least one of the first dummy light emitting element or the second dummy light emitting element from being emitted outside the display panel.

6. A display device comprising:
a display panel comprising a display area and a non-display area;
a plurality of light emitting elements in the display area; and
a current detection device in the non-display area,
wherein:
the current detection device comprises a controller, and a current detection circuit configured to be controlled by the controller;
the current detection circuit comprises a first driver and a second driver;
the first driver comprises a first dummy light emitting element corresponding to a first light emitting element configured to provide light of a first color among the plurality of light emitting elements;
the second driver comprises a second dummy light emitting element corresponding to a second light emitting element configured to provide light of a second color among the plurality of light emitting elements;

the first driver further comprises a first dummy transistor connected between a first terminal and the first dummy light emitting element; and the current detection device further comprises a second terminal connected to a first gate electrode of the first dummy transistor.

7. The display device of claim 6, wherein the current detection device further comprises a third terminal connected to a first anode electrode of the first dummy light emitting element.

8. The display device of claim 7, wherein the current detection device further comprises a fourth terminal connected to a first cathode electrode of the first dummy light emitting element.

9. The display device of claim 8, wherein the second driver further comprises a second dummy transistor connected between a fifth terminal and the second dummy light emitting element.

10. The display device of claim 9, wherein the current detection device further comprises a sixth terminal connected to a second gate electrode of the second dummy transistor.

11. The display device of claim 10, wherein the current detection device further comprises a seventh terminal connected to a second anode electrode of the second dummy light emitting element.

12. The display device of claim 11, wherein a second cathode electrode of the second dummy light emitting element is connected to the fourth terminal.

13. The display device of claim 12, further comprising a resistor connected between the first anode electrode of the first dummy light emitting element and the second anode electrode of the second dummy light emitting element.

14. A display device comprising:

a display panel comprising a display area and a non-display area;

a plurality of light emitting elements in the display area; and a current detection device in the non-display area, wherein:

the current detection device comprises a controller, and a current detection circuit configured to be controlled by the controller;

the current detection circuit comprises a first driver and a second driver;

the first driver comprises a first dummy light emitting element corresponding to a first light emitting element configured to provide light of a first color among the plurality of light emitting elements;

the second driver comprises a second dummy light emitting element corresponding to a second light emitting element configured to provide light of a second color among the plurality of light emitting elements;

the first driver of the current detection circuit comprises a plurality of first drivers; and the second driver of the current detection circuit comprises a plurality of second drivers.

15. The display device of claim 14, wherein a first anode electrode of the first dummy light emitting element of each of the plurality of first drivers is connected to each other, and wherein a first cathode electrode of the first dummy light emitting element of each of the plurality of first drivers is connected to each other.

16. The display device of claim 15, wherein each of the plurality of first drivers further comprises a first dummy transistor, wherein a first gate electrode of the first dummy transistor of each of the plurality of first drivers is connected to each other, wherein a first drain electrode of the first dummy transistor of each of the plurality of first drivers is connected to each other, and wherein a first source electrode of the first dummy transistor of each of the plurality of first drivers is connected to each other.

17. The display device of claim 16, wherein a second anode electrode of the second dummy light emitting element of each of the plurality of second drivers is connected to each other, and wherein a second cathode electrode of the second dummy light emitting element of each of the plurality of second drivers is connected to each other.

18. The display device of claim 17, wherein each of the plurality of second drivers further comprises a second dummy transistor, wherein a second gate electrode of the second dummy transistor of each of the plurality of second drivers is connected to each other, wherein a second drain electrode of the second dummy transistor of each of the plurality of second drivers is connected to each other, and wherein a second source electrode of the second dummy transistor of each of the plurality of second drivers is connected to each other.

19. The display device of claim 14, wherein the first dummy light emitting element of each of the plurality of first drivers is configured to provide the light of the first color.

20. The display device of claim 14, wherein the second dummy light emitting element of each of the plurality of second drivers is configured to provide the light of the second color.

* * * * *